US011840923B2

(12) United States Patent
Jones

(10) Patent No.: US 11,840,923 B2
(45) Date of Patent: Dec. 12, 2023

(54) ALD-THIN LAYER COATING APPLICATIONS FOR SENSING TELEMETRY THROUGH EVANESCENT WAVE INTERACTIONS

(71) Applicant: HALLIBURTON ENERGY SERVICES, INC., Houston, TX (US)

(72) Inventor: Christopher Michael Jones, Houston, TX (US)

(73) Assignee: HALLIBURTON ENERGY SERVICES, INC., Houston, TX (US)

(*) Notice: Subject to any disclaimer, the term of this patent is extended or adjusted under 35 U.S.C. 154(b) by 587 days.

(21) Appl. No.: 17/058,474

(22) PCT Filed: Jan. 3, 2020

(86) PCT No.: PCT/US2020/012195
§ 371 (c)(1),
(2) Date: Nov. 24, 2020

(87) PCT Pub. No.: WO2021/137871
PCT Pub. Date: Jul. 8, 2021

(65) Prior Publication Data
US 2021/0381368 A1    Dec. 9, 2021

(51) Int. Cl.
*E21B 47/135* (2012.01)
*G01V 8/12* (2006.01)
(Continued)

(52) U.S. Cl.
CPC ...... *E21B 47/135* (2020.05); *C23C 16/45536* (2013.01); *E21B 47/09* (2013.01);
(Continued)

(58) Field of Classification Search
CPC .......... C23C 16/45536; E21B 17/1007; E21B 17/1085; E21B 47/07; E21B 47/09;
(Continued)

(56) References Cited

U.S. PATENT DOCUMENTS

2003/0107739 A1* 6/2003 Lehmann ............... G01N 21/39
356/437
2003/0109055 A1* 6/2003 Lehmann ................ G01J 3/42
422/82.11

(Continued)

FOREIGN PATENT DOCUMENTS

WO     2012094094 A2     7/2012

OTHER PUBLICATIONS

International Search Report, Response and Written Opinion, PCT Application No. PCT/US2020/012915, dated Sep. 28, 2020.

*Primary Examiner* — David L Singer
(74) *Attorney, Agent, or Firm* — NOVAK DRUCE CARROLL LLP

(57) ABSTRACT

Layered coating applications for sensing telemetry are provided. An example method can include depositing, on a surface of a tool, a waveguide including a first layer of low refractive-index material, a second layer of high refractive-index material applied to a surface of the first layer, and a third layer of low refractive-index material applied to a surface of the second layer; configuring an evanescent wave interaction region on the waveguide, the evanescent wave interaction region including the first layer of low refractive-index material, the second layer of high refractive-index material, and an outer layer of low refractive-index material having a reduced thickness; configuring, at a second location of the waveguide, a non-uniformity configured to reflect light; determining characteristics of the reflected light after traveling through the evanescent wave interaction region; and based on the characteristics of light reflected by the non-uniformity, detecting characteristics of an environment of the tool.

19 Claims, 14 Drawing Sheets

(51) Int. Cl.
  *G02B 6/122* (2006.01)
  *G02B 6/10* (2006.01)
  *E21B 47/09* (2012.01)
  *G01N 21/17* (2006.01)
  *G02B 27/56* (2006.01)
  *G02B 6/12* (2006.01)
  *G01N 21/31* (2006.01)
  *G01N 21/01* (2006.01)
  *C23C 16/455* (2006.01)
  *E21B 47/07* (2012.01)
  *E21B 17/10* (2006.01)
  *G01N 21/3577* (2014.01)
  *G01N 21/552* (2014.01)

(52) U.S. Cl.
  CPC .............. *G01N 21/17* (2013.01); *G01V 8/12* (2013.01); *G02B 6/10* (2013.01); *G02B 6/122* (2013.01); *G02B 27/56* (2013.01); *E21B 17/1007* (2013.01); *E21B 17/1085* (2013.01); *E21B 47/07* (2020.05); *G01N 21/31* (2013.01); *G01N 21/3577* (2013.01); *G01N 21/552* (2013.01); *G01N 2021/0118* (2013.01); *G02B 2006/12138* (2013.01)

(58) Field of Classification Search
  CPC .......... E21B 47/135; G01N 2021/0118; G01N 21/17; G01N 21/31; G01N 21/3577; G01N 21/552; G01V 8/12; G02B 2006/12138; G02B 27/56; G02B 6/10; G02B 6/122
  See application file for complete search history.

(56) References Cited

U.S. PATENT DOCUMENTS

| | | |
|---|---|---|
| 2006/0177939 A1 | 8/2006 | Lehmann et al. |
| 2008/0095495 A1* | 4/2008 | Taverner ............ G02B 6/03611 374/E11.019 |
| 2008/0314138 A1 | 12/2008 | Brady |
| 2010/0177310 A1 | 7/2010 | Difoggio |
| 2012/0018167 A1* | 1/2012 | Konopczynski ........ E21B 43/14 166/66 |
| 2012/0170023 A1* | 7/2012 | Szobota ............... G01N 21/552 356/51 |
| 2012/0223221 A1* | 9/2012 | Jones ....................... G01V 8/24 250/269.1 |
| 2013/0336612 A1 | 12/2013 | Pearce |
| 2015/0115146 A1* | 4/2015 | Jones ................... G01N 21/648 250/269.1 |
| 2015/0369043 A1* | 12/2015 | Pelletier ................ G01N 21/59 356/416 |
| 2016/0116403 A1* | 4/2016 | Lear ....................... G02B 27/56 356/70 |

* cited by examiner

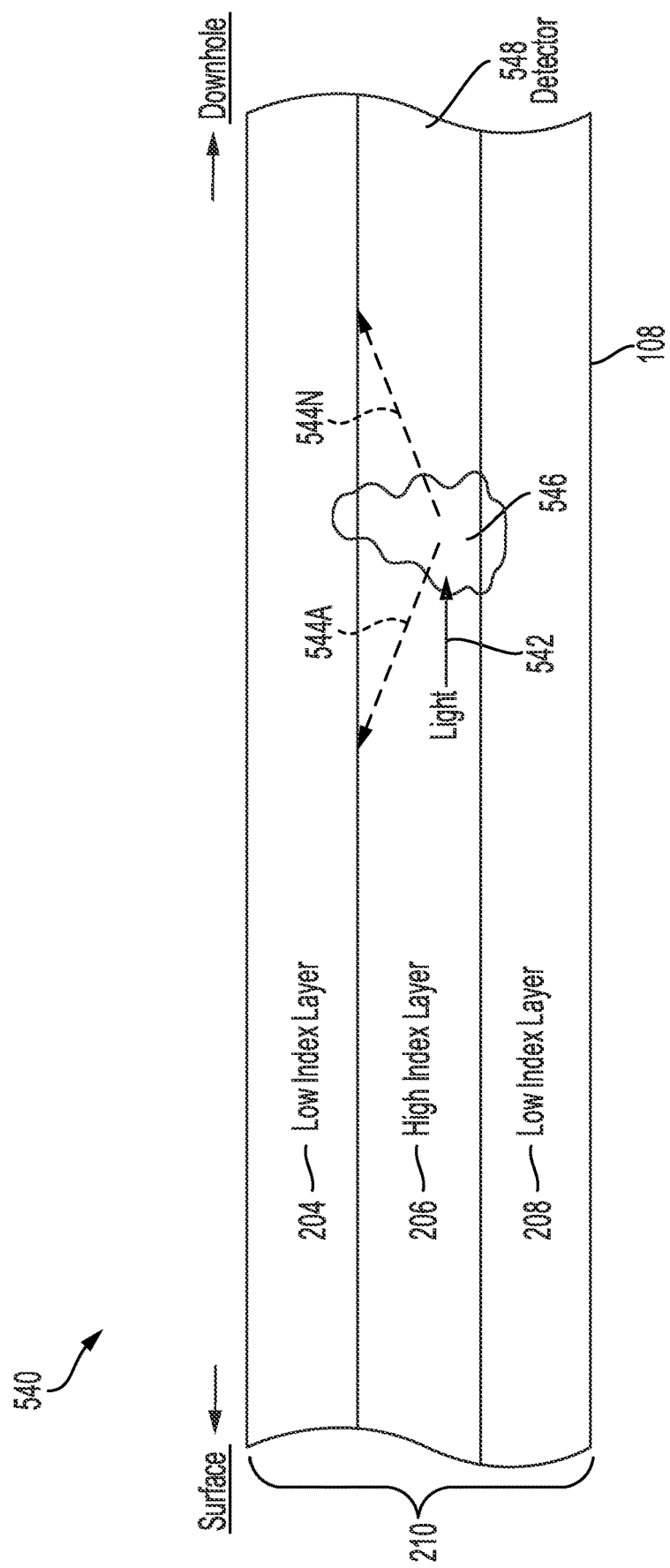

ALD-THIN LAYER COATING APPLICATIONS FOR SENSING TELEMETRY THROUGH EVANESCENT WAVE INTERACTIONS

CROSS-REFERENCE TO RELATED APPLICATIONS

This application is related to U.S. Non-Provisional Application Ser. No. 16/536,922, filed on Aug. 9, 2019, and International Application No. PCT/US2019/045953, filed on Aug. 9, 2019, both of which are incorporated herein by reference in their entirety.

TECHNICAL FIELD

The present technology generally pertains to data communications between the surface of a well and a downhole tool.

BACKGROUND

Logging while drilling (LWD) is a technique used in the oil and gas industry to measure formation properties during, or shortly after, drilling operations. Typically, logging tools are integrated into a bottomhole assembly (BHA) of a well and used to capture and transmit measurements to the surface for further evaluation. The measurements can provide useful well information such as, for example, formation pressure, porosity, rate of penetration, and resistivity. The measurements can also help drillers and engineers predict drilling hazards and guide the well placement to ensure the wellbore remains within a zone of interest.

Measurement while drilling (MWD) is a technique used in oil and gas industry to obtain directional-drilling measurements or wellbore survey data during drilling operations. The MWD data can then be used to manage the drilling path or trajectory for the well. For example, the MWD data can be used to provide geo-steering commands to the BHA of a well for directional drilling and/or wellbore placement.

LWD/MWD measurements and data can be transmitted to the surface using, for example, mud-pulse telemetry or wired links. However, current telemetry systems used to communicate information to or from the surface of a well can be slow and prone to interference caused by the harsh conditions downhole. Moreover, current telemetry systems can often interrupt well operations by occupying the fluid medium within the tubing, restricting pumping configurations, and so forth. These and other limitations can negatively impact data communications in a well system, interrupt operations that rely or benefit from such data, and provide limited flexibility for the type of measurements that can be obtained and the process for obtaining such measurements.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which:

FIG. 5C is a diagram illustrating a light beam transmitted through an example configuration of an optical waveguide having a scattering center, in accordance with some examples;

DETAILED DESCRIPTION

Figure 1:
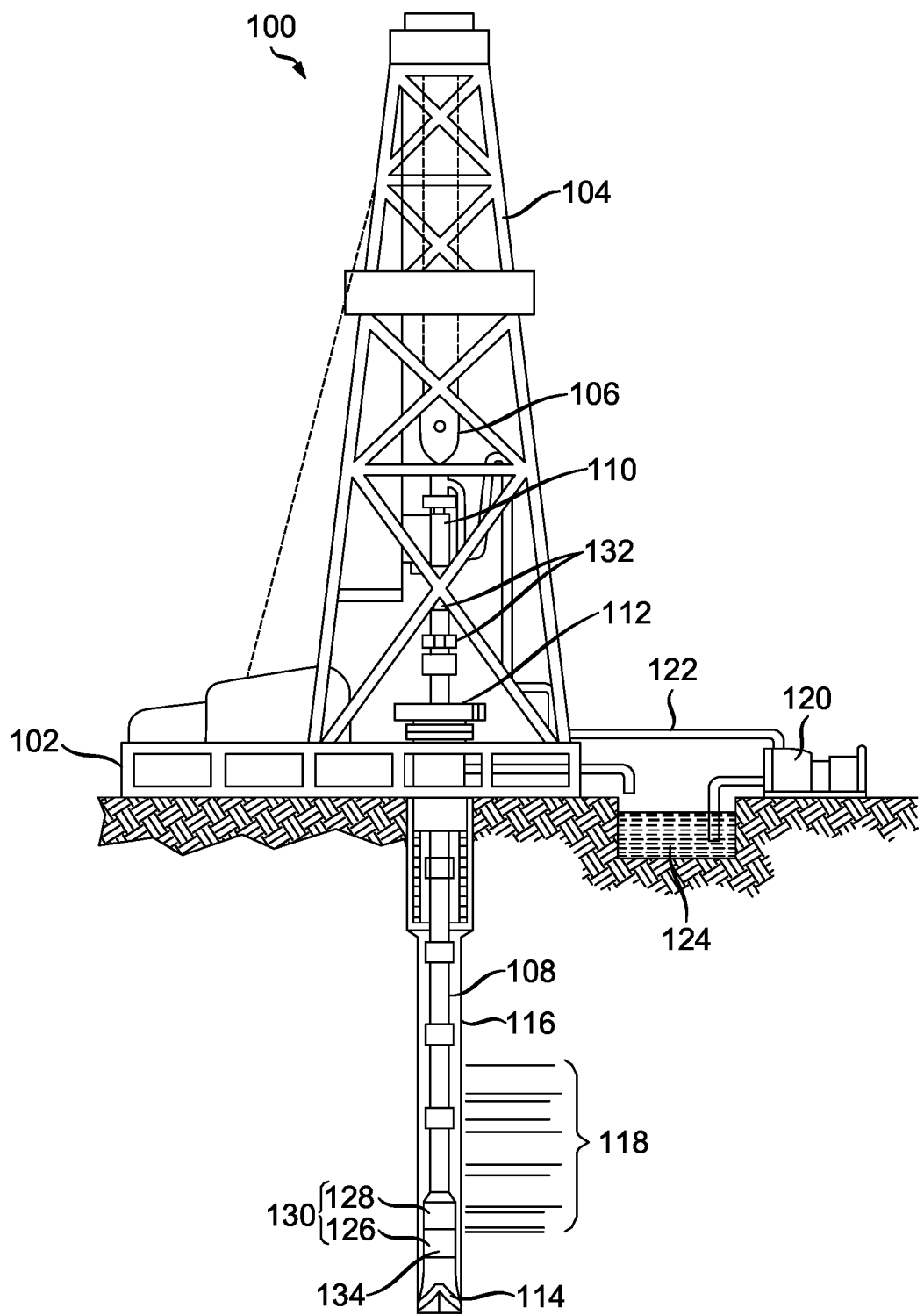
FIG. 1 is a schematic diagram of an example logging while drilling (LWD) or measurement while drilling (MWD) wellbore operating environment, in accordance with some examples.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The technologies herein can provide a light pipe for using light to transmit information in an environment, detect conditions in the environment, and detect characteristics of tools and components in the environment. The light pipe can be an optical waveguide for carrying light from one location to another. For example, the light pipe can be an optical waveguide for carrying light between a surface location of a wellbore and a downhole location of the wellbore. In some implementations, the optical waveguide can be formed using the inner surface of a drill pipe in the wellbore. For example, the inner surface of a drill pipe can be coated with a series of low and high refractive-index materials for a given wavelength. The high-refractive index material can be surrounded by adjacent coats of low-refractive index material that act as a buffer to trap light within the high-refractive index. This way, the high-refractive index material can provide a medium (e.g., the optical waveguide) for carrying the light through total internal reflection. The high-refractive index material can propagate light without (or with limited) loss or transmission through the boundary.

To communicate information through the optical waveguide, a light source can inject light into the optical waveguide at a given wavelength and angle of incidence. For total internal reflection, the incident angle $\theta_i$ can be greater than or equal to the critical angle $\theta_c$. The light source can be, for example and without limitation, a laser, a light-emitting diode (LED), a light bulb, and the like. One or more light sources and detectors (e.g., receivers) can be located on the surface of the wellbore and/or downhole. In some cases, different frequencies of light can be used for different channels of communication. For example, different frequencies of light can be used for downhole communications and uphole communications.

The high and/or low refractive-index materials can be deposited in the inner surface of the drill pipe using, for example, plasma enhanced chemical vapor deposition (PECVD) or plasma-enhanced atomic layer deposition (ALD). The plasma process can provide sufficient kinetic energy to achieve a chemical reaction at the surface within the drill pipe. Such deposition techniques can allow for a uniform, conformal coverage for coating the internal surface of the drill pipe. In some cases, the high and/or low refractive-index materials can be deposited using other deposition processes that rely on heating and thermal methods to provide sufficient kinetic energy for the chemical reaction.

In some implementations, the optical waveguide can include one or more reflectors or scattering centers for reflecting, transmitting, and/or scattering portions of light propagated through the optical waveguide. For example, the optical waveguide can include a partial reflector for reflecting a portion of incident light carried by the optical waveguide or a full reflector for reflecting incident light carried by the optical waveguide. The reflected light can be analyzed to detect characteristics and/or conditions of an object or tool (e.g., a drill pipe, a transmission line, a nuclear reactor structure, a bridge, an airplane, etc.) where the optical waveguide is implemented.

For example, the reflected light can be analyzed to sense a torque, strain, stress, joint, geometry, configuration, a point of failure, corrosion, erosion, an alignment of a connecting interface, damage, and/or any other properties of an object where the optical waveguide is implemented. As another example, the reflected light can be analyzed to sense components and/or conditions around the object where the optical waveguide is implemented, such as a temperature, a pressure, a fluid, a gas, a material, a formation, an accumulation of an element or substance (e.g., gas accumulation, fluid accumulation, etc.), a gap between adjacent materials or substances (e.g., a mud gap, an air gap, etc.), and/or any other conditions around the object.

In some examples, to sense such conditions and/or characteristics, the reflected light can be analyzed to determine any changes in the reflected light relative to the light carried by the optical waveguide prior to being reflected. Such changes can include, for example, changes in frequency, intensity, wavelength, etc. Other aspects of the reflected light can also be analyzed to sense such conditions, such as attenuation or a spectroscopic fingerprint of the reflected light.

In some implementations, the optical waveguide can also be configured with one or more evanescent wave interaction regions that allow light carried by the optical waveguide to interact with components and/or an environment outside of the optical waveguide. For example, the optical waveguide can be configured to include one or more sites where the optical waveguide has a reduced thickness that allows a portion of the light to extend beyond the optical waveguide at such sites and interact with any adjacent components or environments. The reduced thickness can create the evanescent wave interaction region and thus can allow the light to interact with a component or environment outside of, or adjacent to, the optical waveguide. In some cases, the reduced thickness of the optical waveguide at the one or more sites (or of one or more layers of the optical waveguide at the one or more sites) can be smaller than one or more wavelengths of light. By reducing the thickness to be less than the wavelength of light carried by the optical waveguide, the evanescent wave interaction can be enhanced.

In some examples, the evanescent wave interaction enabled by such evanescent wave interaction regions can be used to detect components (e.g., fluids, materials, gasses, substances, elements, objects, etc.) and/or conditions outside of, or adjacent to, the optical waveguide. For example, an evanescent wave interaction region on an optical waveguide deposited on an inner surface of a drill pipe can be used to sense any fluids, materials, gasses, chemicals, substance accumulations, formations, etc., on the inside of the drill pipe. The evanescent wave interactions can affect characteristics or properties of the light, such as a wavelength, an intensity, a frequency, an attenuation, etc. The characteristics or properties of a portion of light reflected or received after an evanescent wave interaction can thus be analyzed to sense the components or conditions as described herein.

Figure 10A:
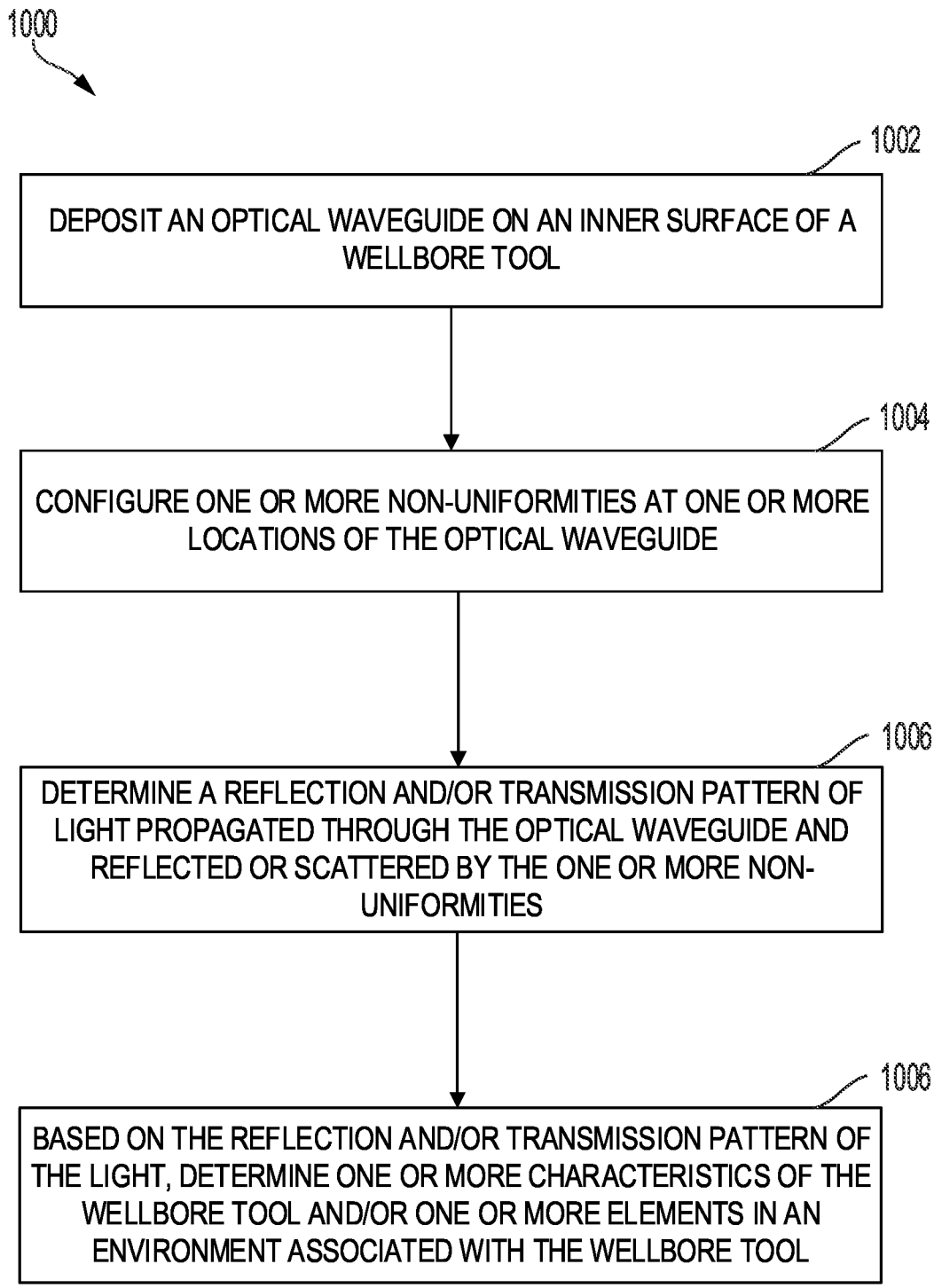
FIG. 10A is a flowchart of an example method for implementing an optical waveguide to sense conditions and characteristics associated with a wellbore tool, in accordance with some examples.
Figure 10B:
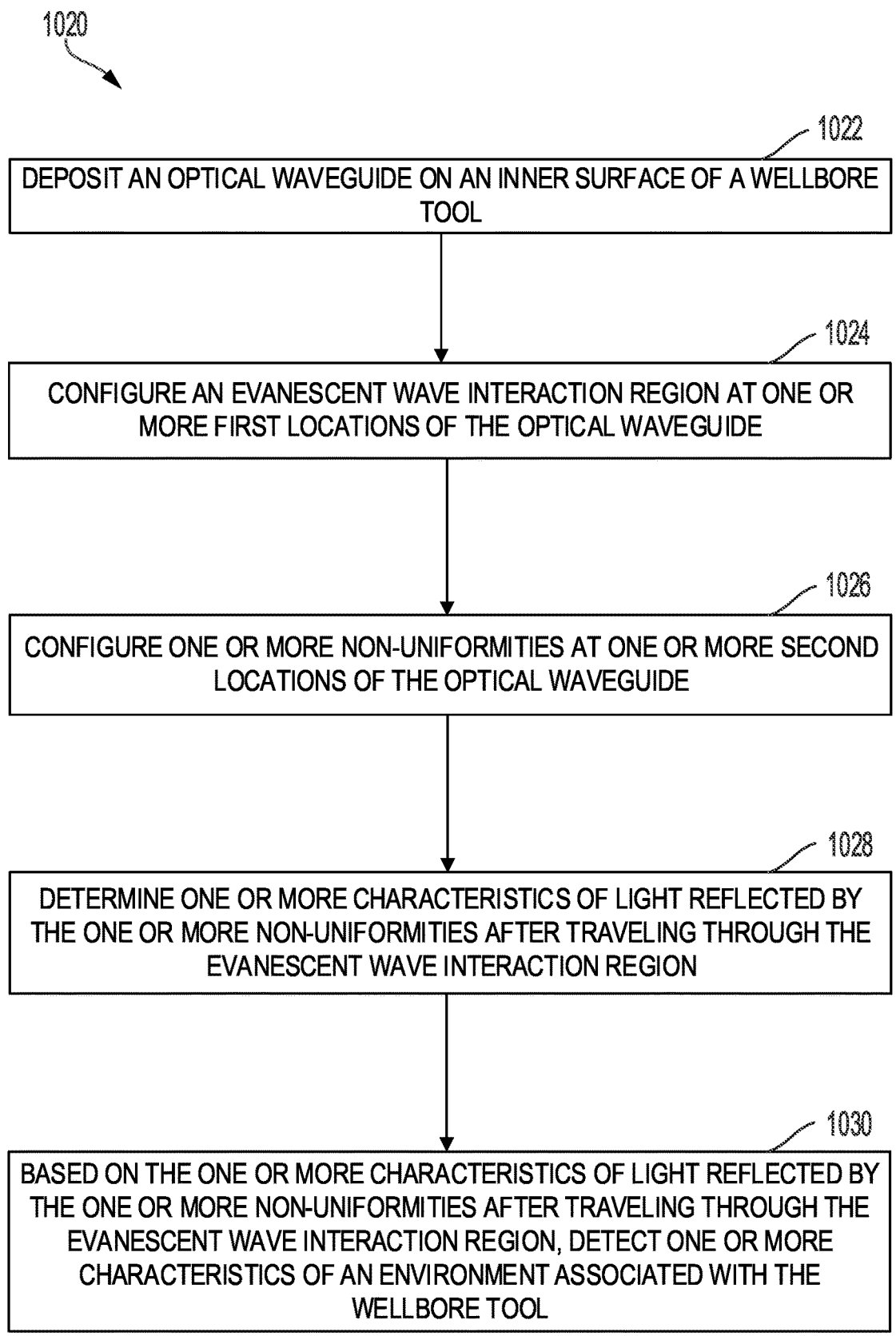
FIG. 10B is a flowchart of an example method for implementing an optical waveguide to obtain measurements and sense conditions using evanescent wave interactions, in accordance with some examples.
Figure 11:
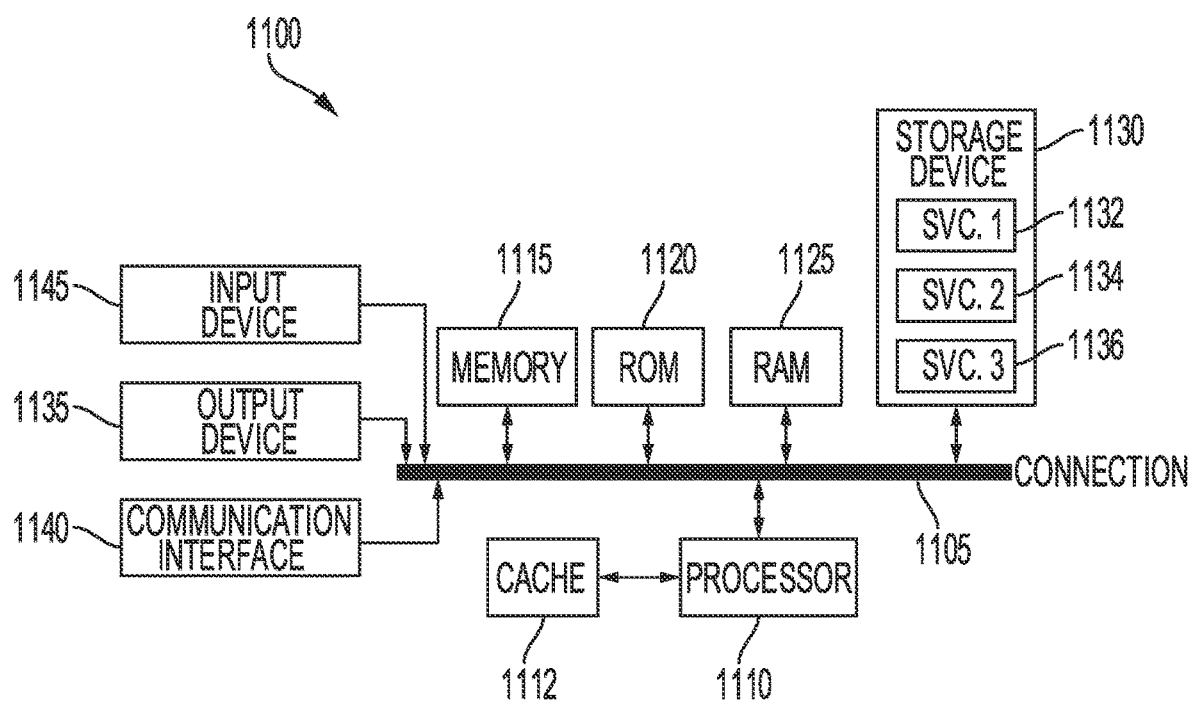
FIG. 11 is a schematic diagram of an example computing device architecture, in accordance with some examples.

Additional details, examples, and aspects of the disclosure will be described below as follows. The disclosure will begin with a description of example systems, environments and techniques for communicating data through an optical waveguide and sensing information using reflectors and/or evanescent wave interaction regions implemented on the optical waveguide, as illustrated in FIGS. 1 through 9. A description of example methods for implementing an optical waveguide to sense conditions and characteristics associated with a wellbore tool, as shown in FIGS. 10A and 10B, will follow. The disclosure concludes with a description of an example computing system architecture, as shown in FIG. 11, which can be implemented for performing various computing operations and functions as disclosed herein. These variations will be described herein as the various embodiments are set forth. The disclosure now turns to FIG. 1.

FIG. 1 illustrates a schematic view of a logging while drilling (LWD) and/or measurement while drilling (MWD) wellbore operating environment 100 in in accordance with some examples of the present disclosure. As depicted in FIG. 1, a drilling platform 102 can be equipped with a derrick 104 that supports a hoist 106 for raising and lowering a drill string including a drill pipe 108. The hoist 106 suspends a top drive 110 suitable for rotating and lowering the drill pipe 108 through a well head 112. A drill bit 114 can be connected to the lower end of the drill pipe 108. As the drill bit 114 rotates, the drill bit 114 creates a wellbore 116 that passes through various formations 118. A pump 120 can circulate drilling fluid through a supply pipe 122 to the top drive 110, down through the interior of the drill pipe 108 and orifices in the drill bit 114, back to the surface via the annulus around the drill pipe 108, and into a retention pit 124. The drilling fluid transports cuttings from the wellbore 116 into the retention pit 124 and aids in maintaining the integrity of the wellbore 116. Various materials can be used for drilling fluid, including oil-based fluids and water-based fluids.

Logging tools 126 can be integrated into a bottom-hole assembly 130 near the drill bit 114. As the drill bit 114 extends the wellbore 116 through the formations 118, logging tools 126 collect measurements relating to various formation properties as well as the orientation of the tool and various other drilling conditions. The bottom-hole assembly 130 can also include a telemetry sub 128 to transfer measurement data to a surface communication device 132 and to receive commands from the surface. In some cases, the telemetry sub 128 can communicate with the surface communication device 132 using mud pulse telemetry. In some instances, the telemetry sub 128 does not communicate with the surface, but rather stores logging data for later retrieval at the surface when the logging assembly is recovered.

The logging tools 126 can include one or more tool components spaced apart from each other and communicatively coupled with one or more wires and/or other media. The logging tools 126 may also include one or more computing devices 134 communicatively coupled with one or more of the one or more tool components by one or more wires and/or other media. The one or more computing devices 134 may be configured to control or monitor a performance of the tool, process logging data, and/or carry out one or more aspects of the methods and processes of the present disclosure.

In some cases, one or more of the logging tools 126 may communicate with the surface communication device 132 by a wire or a waveguide. Moreover, in some cases, one or more of the logging tools 126 may receive electrical power from a wire that extends to the surface, including wires extending through the drill pipe 108. In at least some instances, one or more of the logging tools 126 can communicate with the surface communication device 132 by wireless signal transmission. For example, the one or more logging tools 126 can include a light-emitting device, such as a laser, LED, light bulb, optical sensor system, etc., for communicating optical data signals to the surface communication device 132 using an inner surface of the drill pipe 108 as a waveguide (e.g., light pipe) for carrying the optical data signals. As another example, the inner surface of the drill pipe 108 can be coated with a layered structure or optical medium for communicating optical data signals.

In some cases, the logging tools 126 can include an optical sensor system that can transmit optical data signals (light) to a surface communication device 132 and receive optical data signals from a surface location (e.g., surface communication device 132). The optical sensor system can include a light source, a light detector, a spectral measuring device, and/or one or more data processing components. The optical data signals can be communicated between the optical sensor system and the surface location (e.g., the surface communication device 132) using the inner surface of the drill pipe 108 as a waveguide, as further described herein.

In some examples, the logging tools 126 can transmit, to a surface communication device 132, data including measurements and detected conditions such as, for example and without limitation, formation fluid density, temperature, pressure, azimuthal orientation of the drill bit 114, etc. For example, the logging tools 126 can use an optical waveguide, such as optical waveguide 210 shown in FIG. 2 below, to transmit optical data signals including various measurements and/or detected conditions.

In the case of directional drilling, measurement while drilling (MWD)/logging while drilling (LWD) procedures are supported both structurally and communicatively. For example, a communication medium, such as optical waveguide 210 shown in FIG. 2, can be used to transmit directional-drilling measurements and/or wellbore survey data from a downhole location to a surface location. As another example, a communication medium, such as optical waveguide 210 shown in FIG. 2, can be used to transmit geo-steering commands to the bottom-hole assembly 130.

Figure 2:
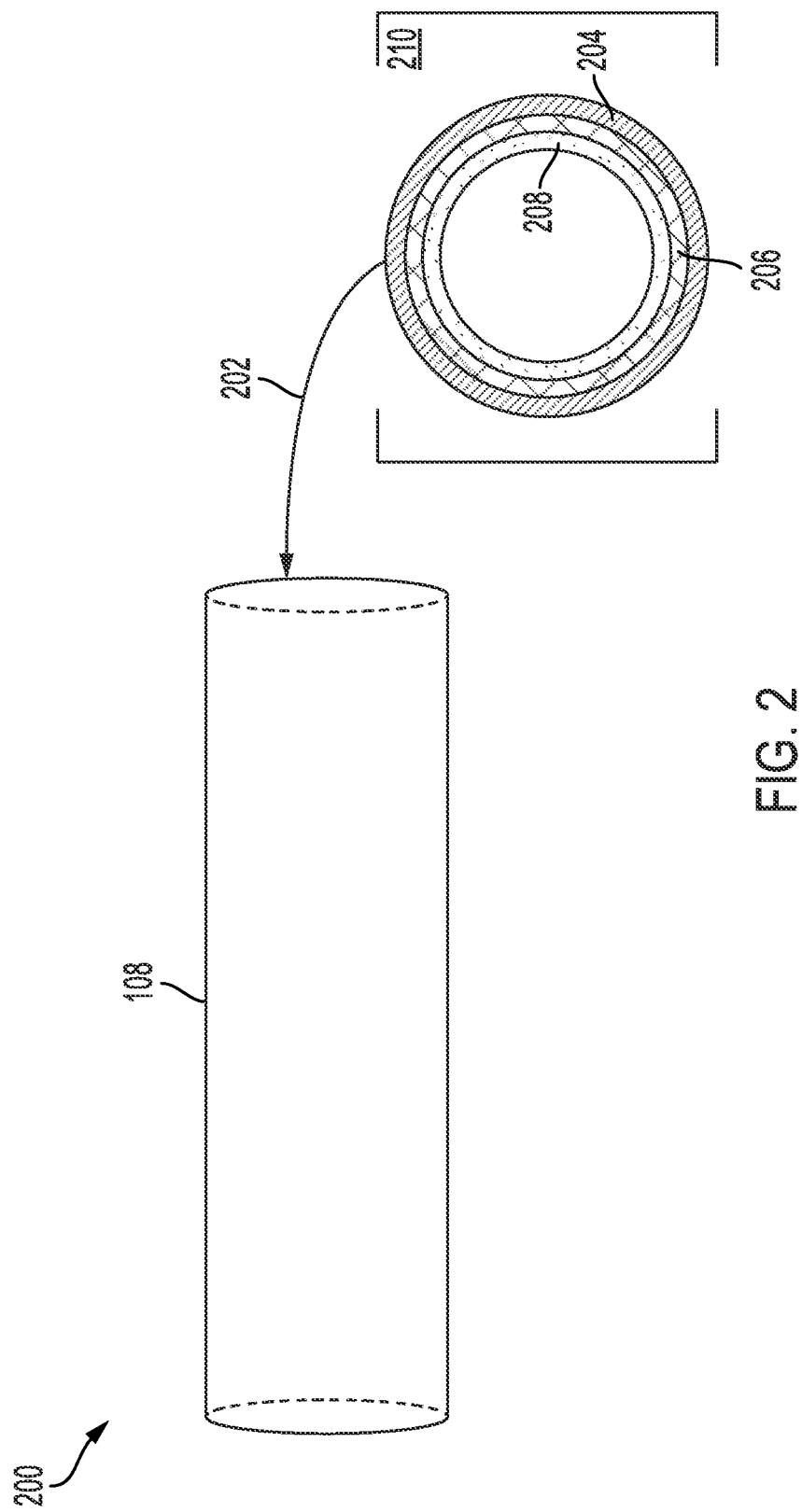
FIG. 2 is a diagram of an example configuration of an optical waveguide formed using an inner surface of a drill pipe, in accordance with some examples.

Having disclosed an example drilling environment, the disclosure now turns to FIG. 2, which illustrates an example configuration 200 of an optical waveguide 210 formed using an inner surface 202 of the drill pipe 108. The optical waveguide 210 can include a sequence of layers 204-208 (e.g., films or materials) of low and high refractive index materials deposited within the inner surface 202 of the drill pipe 108.

In this example, the inner surface 202 of the drill pipe 108 is first coated with a low index layer 204 of a low-refractive index material. The low-refractive index material used to create the low index layer 204 can be any coating or film that has a lower refractive index than the propagation medium, which in this example is a high index layer 206 adjacent to, or coated over, the low index layer 204. Non-limiting examples of low-refractive index materials that can be used for the low index layer 204 include silicon dioxide (SiO2), sapphire crystal (Ai2O3), fused silica, or any other low index dielectric oxide film. In one illustrative example, for incident light with a wavelength of 1.5 microns, the refractive index of SiO2 can be approximately 1.45 and the refractive index for Ai2O3 can be approximately 1.65. These example values can be specific to the deposition process used and may change for different processes and deposition conditions.

The low index layer 204 can be made sufficiently thick to support a high-refractive index material used for the high index layer 206, without any (or with limited) stress due to lattice mismatching with the drill pipe 108. In some examples, a thin film with a thickness of several (e.g., 1-5) microns can be used for the low index layer 204. In other examples, a thicker film can be used to decouple potential energy loss through evanescent waves and/or prevent light carried by the high index layer 206 from extending beyond the high index layer 206 and the low index layer 204 and interacting with the drill pipe 108 (for example if the high index layer 206 and low index layer 204 are thinner than the wavelength of the light carried).

As previously noted, the low index layer 204 can be coated with a high index layer 206 of high-refractive index material. As previously noted, the high-refractive index material has a higher refractive index than the low-refractive index material used in the low index layer 204. Non-limiting examples of high-refractive index material that can be used for the high index layer 206 include silicon (Si), germanium (Ge), titanium dioxide (TiO2), gallium arsenide (GaAs), or any other high index semiconductor materials including any semiconductor materials with refractive indices greater than ~2 and negligible absorption (e.g., extinction coefficient) over the wavelength of interest. For Si, the refractive index and extinction coefficient (for a given wavelength=1500 nm) are 3.485 and 0, respectively. Enhanced transmission percentages can be achieved by minimizing absorption and scattering losses in the high-refractive index material.

The high index layer 206 can serve as a propagation medium or waveguide for light. For example, the high index layer 206 can carry light transmitted from one end or location of the drill pipe 108 (e.g., at or near the surface of the wellbore) to another end or location of the drill pipe 108 (e.g., downhole), and vice versa. The light transmitted through the high index layer 206 can carry data and enables high-speed communications. The light transmitted through the high index layer 206 can also be used to detect or measure conditions or characteristics of the drill pipe 108 (e.g., erosion, corrosion, material gaps, join geometries, torque, tension, strain, pressure, temperature, etc.) and/or any substances inside of the drill pipe 108 (e.g., fluids, gasses, wax formations, etc.), as further described herein.

The high index layer 206 can then be coated with a second low index layer 208 of low-refractive index material. The low-refractive index material in the second low index layer 208 can include a material having a lower index of refraction than the high-refractive index material in the high index layer 206, such as SiO2, Ai2O3, fused silica, or any other low index dielectric oxide film. With the low index layers 204 and 208 applied on both sides or surfaces of the high index layer 206, the high-refractive index material in the high index layer 206 is buffered by a low-refractive index material on each surface. The high index layer 206 can thus become an optical waveguide or propagation medium by total internal reflection of light transmitted at an angle of incidence that is greater or equal to the critical angle: Theta=ArcSin($n_L/n_H$).

In FIG. 2, the entire inner surface 202 is coated with the layers 204-208. This can allow the entire inner surface 202 of the drill pipe to be used as a waveguide, and can provide better coupling across any joints between different drill pipes or components. This can also provide resistance to scratches or other damage to the inside (e.g., 202) of the drill pipe 108, and can limit or reduce any signal interruption or loss due to scratches or damage in a particular area inside the drill pipe 108.

For example, if the waveguide 210 has a scratch across the layers 204-208 at a particular area within the inner surface 202 of the drill pipe 108, the scratch can cause interruption or loss of signals traveling through the waveguide 210 along the path of the scratch. If the entire inner surface 202 of the drill pipe 108 is coated with the layers 204-208 that form the waveguide 210, the remaining unscratched surface area in the inner surface 202 of the drill pipe 108 can continue to carry signals without being impacted by the scratch. Thus, in the example where the entire inner surface 202 is coated with the layers 204-208, the negative impact on signals carried through the waveguide 210 is significantly reduced, as only a smaller subset of signals that encounter the scratch will be affected by the scratch, and the waveguide 210 can continue carrying signals despite the scratch.

In some implementations, the layers 204-208 can be applied across multiple pipes to extend the waveguide 210 across the multiple pipes. In some cases, the high refractive-index material can extend to the coupling surface between two pipes (e.g., drill pipe 108 and another drill pipe) to account for any mismatch between the interior surfaces of the two pipes. In some cases, the coupling surface between the two pipes can be shaped in a mating beveled surface to increase the coupling. Moreover, a high index of refraction jointing material such as silicone can be used to increase the coupling between the two surfaces of two pipes in order to increase transmission probabilities and reduce potential transmission loss. For example, in cases where multiple tool strings or pipes are joined together, the joints can be coated with an index-matching layer or gel to minimize optical transmission loss through the high refractive-index material. In some cases, light transmitted through the waveguide 210 can be used to measure or detect optimal join geometries, pipe alignments, and/or pipe coupling, as further described herein.

In some cases, the deposition of high refractive-index and/or low refractive-index materials used to create the layers 204-208 can be performed using plasma-enhanced atomic layer deposition (ALD) or plasma-enhanced chemical vapor deposition (PECVD). ALD and/or PECVD can allow for a fast deposition rate cycle and can accommodate the deposition of single compound semiconductor films (e.g., Si, Ge, etc.) as well as scratch or abrasive resistant films such as diamond or diamond-like carbide (DLC). In some examples, ALD can be used for low refractive-index materials (and/or any other binary compound).

The deposition process can provide sufficient kinetic energy to achieve the chemical reaction at the surface within the drill pipe 108. Other deposition processes can also be used. For example, other deposition processes that rely on heating and thermal methods to provide sufficient kinetic energy can be used. The various deposition techniques described herein can allow for the uniform, conformal coverage to coat the internal surface 202 of the drill pipe 108.

In some cases, communication channels used to transmit light within the inner surface 202 of the drill pipe 108 can be optimized by adding layers of frequency. For example, light frequencies can be varied to determine a best data rate and/or a lowest bit error rate for light signals. Moreover, in some implementations, a waveguide formed from a sequence of low-high-low index layers can be deposited in one or more locations on the drill pipe 108 to carry light between an interior of the drill pipe 108 and an exterior of the drill pipe 108.

For example, a waveguide can be deposited to run between an interior and an exterior of the drill pipe 108 (or other vessel) using a Mobius strip, which has only one side/surface and only one boundary. The Mobius strip can combine low-high-low index layers to form a waveguide as described herein. The Mobius strip can thus carry light signals between an interior and exterior of the drill pipe 108.

In some examples, the waveguide 210 can include a buffer layer before the low index layer 204 and/or the second low index layer 208. For example, before depositing the layers 204-208 on the inner surface 202 of the drill pipe 108, a buffer layer can be optionally deposited on the inner surface 202 of the drill pipe 108. The buffer layer can provide a buffer for the other layers 204-208 to help protect the other layers 204-208 from damage, abrasion, etc., and/or facilitate the deposition or adherence of the other layers 204-208 on the inner surface 202 of the drill pipe 108. In such examples, once the inner surface 202 of the drill pipe 108 is coated with the buffer layer, the low index layer 204 can be applied over (e.g., on the surface), or adjacent to, the buffer layer, and the remaining layers (206 and 208) can be applied as previously described.

In some examples, a protective layer can be applied over the surface of the second low index layer 208. The protective layer can coat the second low index layer 208 with a scratch or abrasive resistant barrier to protect the entire waveguide configuration (e.g., layers 204-208) from potential damage. In some examples, the protective layer can include a film or coat of diamond or diamond-like carbon (DLC).

In one example implementation, the layers 204-208 of the waveguide 210 can include a first film of sapphire on the drill pipe 108 (layer 204) followed by a film of silicon (layer 206), then followed by another film of sapphire (layer 208). In some cases, the file of sapphire (layer 208) can be followed by a film of a diamond-like material, which can provide a protective layer. The films in this example can provide durability and an adequate sequence of low, high, low refractive-index materials for light propagation by total internal reflection. In another example implementation, the sequence of layers 204-208 can include a first film of sapphire on the drill pipe 108 (layer 204) followed by a film of titanium dioxide (layer 206), followed by another film of sapphire (layer 208), and the film of sapphire (layer 208) can be followed by a film of diamond or a diamond-like material, which can provide a protective layer.

While FIG. 2 is shown with a specific sequence of a high index layer (206) between two low index layers (204 and 208), it should be noted that this sequence is merely an illustrative example provided for explanation purposes and other configurations are also contemplated herein. For example, in some implementations, the inner surface 202 of the drill pipe 108 can be coated with multiple sequences of low-high-low index layers. In some cases, each sequence of low-high-low index layers can serve as a different optical waveguide or communication channel. To illustrate, a first sequence of low-high-low index layers can be used to form a waveguide for optical data signals transmitted from a surface location of a wellbore to a downhole location, and a second sequence of low-high-low index layers can be used to form another waveguide for optical data signals transmitted from a downhole location to a surface location of the wellbore.

Moreover, while the layers 204-208 in FIG. 2 are shown coating the entire inner surface 202 of the drill pipe 108, it should be noted that this is merely one example implementation provided for explanation purposes and other configurations are also contemplated herein. For example, in some cases, the layers 204-208 can instead be applied to a portion of the inner surface 202 of the drill pipe 108 along a length of the drill pipe 108. To illustrate, a channel or waveguide can be created from the inner surface 202 of the drill pipe 108 by applying the layers 204-208 to a portion of the inner surface 202 of the drill pipe 108 along the length of the drill pipe 108. Additional channels or waveguides can also be similarly created from the inner surface 202 of the drill pipe 108 by applying the layers 204-208 to other portions of the inner surface 202 of the drill pipe 108.

Figure 3:
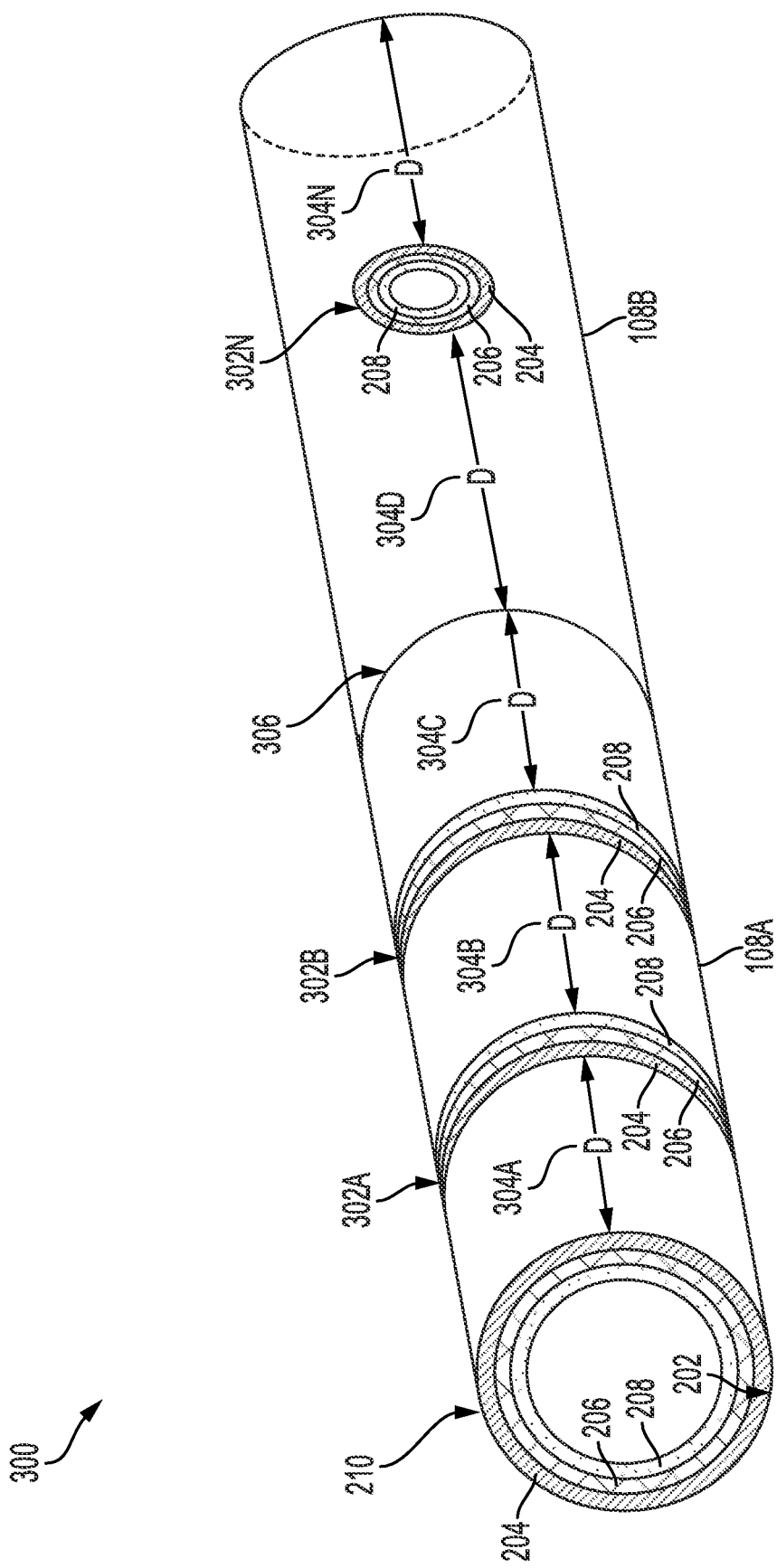
FIG. 3 is a diagram of an example configuration of an optical waveguide implemented across two coupled drill pipes, in accordance with some examples.

FIG. 3 illustrates an example configuration 300 of an optical waveguide 210 (e.g., waveguide 210 including layers 204-208) implemented across two coupled drill pipes 108A-B. In this example, drill pipe 108A and drill pipe 108B are coupled together via a coupling interface 306. The coupling interface 306 can include a coupling mechanism such as a joint, for example.

The coupling interface 306 can create an inhomogeneity between the layers 204-208 of the waveguide 210 on one drill pipe 108A and the other drill pipe 108B. When light traveling across the optical waveguide 210 encounters the coupling interface 306, such inhomogeneity can create a scattering center which can cause scattering of light. The scattering center can also cause other changes to the light, such as a change in the intensity of the scattered light, a change in the frequency of the scattered light, a reduction in the amount of light that traverses the coupling interface 306 and continues along a subsequent portion of the waveguide 210, etc.

The magnitude of scatter can depend on the amount/degree of inhomogeneity at the scattering center. Moreover, the frequency shift of the scattered light can depend on the scattering angle, the velocity of the moving particles, and/or an amount of strain at the scattering center. Accordingly, the scattering and transmission/reflection patterns of light at the coupling interface 306 can be analyzed to determine and/or tune various conditions such as torque, tension, joint geometries, pipe alignment, any gaps, corrosion, erosion, etc.

To illustrate, in some cases, the drill pipes 108A-B can be coupled (e.g., screwed, attached, connected, etc.) at a certain torque and tension. As the drill pipes 108A-B are coupled, the coupling can produce changes in light signals traveling through the waveguide 210, such as changes in the light intensity and frequency. For example, as the tension on the coupling interface 306 changes as the drill pipes 108A-B are coupled, the frequency of back scatter from light that encounters the coupling interface 306 can change. The frequency shift of the light from the back scatter can then be used to determine the tension and stress on the drill pipes 108A-B as they are coupled. The amount of strain can then be used to determine an amount of tension for coupling the drill pipes 108A-B. Similarly, the signal intensity of the back scatter can be used to determine the best alignment for the drill pipes 108A-B. As the drill pipes 108A-B are aligned, the back scatter can be analyzed to determine an optimum signal intensity, which can indicate the best alignment of the drill pipes 108A-B.

In some cases, the surface of the coupling interface 306 and/or the drill pipes 108A-B can be coated with a particular pattern of low-high-low refractive index materials to produce a particular signal level of scattered light as the drill pipes 108A-B are coupled and aligned. The optimum signal intensity can be used to identify the best alignment or whether the coupling interface 306 and/or the drill pipes 108A-B should be coated in a different way. As the signal intensity improves, the signal level of the scatter (e.g., forward scatter) from the backend of the alignment (e.g., the end of the coupling interface 306 opposite to the end first encountered by the light as it traverses the coupling interface 306) can increase and the signal level of the scatter (back scatter) from the frontend of the alignment (e.g., the end of the coupling interface 306 first encountered by the light as it traverses the coupling interface 306) can decrease. A complete loss in forward scatter from the backend of the alignment can also indicate a gap between the drill pipes 108A-B. Thus, such an increase in the forward scatter and decrease in the backscatter can be used when identifying the optimal signal intensity and the best alignment of the drill pipes 108A-B.

In some cases, the coupling interface 306 can be coated with a jointing layer designed to minimize optical transmission loss through the coupling interface 306 and the jointing layer. In some examples, the jointing layer can be an index-matching layer of a high refractory-index material. The high refractory-index material in the jointing layer can improve coupling between the surfaces of the two drill pipes 108A-B and increase transmission probability. Moreover, in some implementations, the coupling surface (e.g., jointing layer) between the two drill pipes 108A-B can be shaped as a mating beveled surface to increase coupling between the drill pipes 108A-B. In some cases, to prevent light propagated by the high index layer 206 from reflecting back within the high index layer 206 when the light reaches the coupling interface 306, the coupling interface 306 and jointing layer can be configured in a particular angle so the joints of the drill pipes 108A-B at the coupling interface 306 are parallel (or substantially parallel) to each other. For example, the joints at the coupling interface 306 can be angled in parallel in a configuration similar to a parallelogram.

The particular, parallel angles of the joints at the coupling interface 306 can cause any light reflection to have an angle of incidence (e.g., relative to the critical angle) that causes the light reflection to be propagated into the low index layer 208. This can prevent back reflection into the high index layer 206, thus reducing or eliminating potential interference and loss due to such back reflection. The light that is not reflected into the low index layer 208 can travel through the high index layer 206 and the jointing layer via total internal reflection. The light can then continue to travel through the high index layer 206 in the second drill pipe 108B. If the second drill pipe 108B is coupled to another component, such as another drill pipe, the light can travel through a similar coupling between them, which can have an index-matching surface layer as described herein, and continue to travel through a high index layer in the coupled component until it reaches its destination (e.g., a receiving device such as a detector).

In some examples, as shown in FIG. 3, a number of refractive interfaces 302A-N can be implemented or included on the waveguide 210 at a number of locations within the drill pipe 108A and/or the drill pipe 108B. The refractive interfaces 302A-N can include reflectors and/or scattering centers. In some examples, a refractive interface (e.g., 302A, 302B, 302N) can be implemented by inducing an index of refraction change in the waveguide 210 at a specific location/region. Such an index of refraction change in the waveguide 210 can be induced by, for example, shooting the specific location/region of the waveguide 210 with laser to make a defect/inhomogeneity at the specific location/region or to melt material (e.g., layers 204, 206, and/or 208) at that specific location/region and cause a local index of refraction change, embedding foreign material inside of the waveguide 210 at the specific location/region, constructing the waveguide 210 with an inhomogeneous index of refraction material at that specific location/region, etching the waveguide 210 at the specific location/region, depositing a different material (e.g., photo degrading material with a certain wavelength sensitivity) at the specific location/region on the waveguide 210, etc.

For example, in some cases, the refractive interfaces 302A, 302B, and/or 302N can be created by shooting a specific region(s) of the waveguide 210 with a laser to cause local melting and resolidification and/or configuring the drill pipes 108A and/or 108B with embedded material and heating the embedded material, both of which can result in an index of refraction change. In other examples, the refractive interfaces 302A, 302B, and/or 302N can be created by etching a specific region(s) of the waveguide 210 and/or depositing a specific material that would cause an index of refraction change. In yet other examples, the drill pipes 108A and/or 108B can be created with a certain pattern(s) at a specific region(s) of the waveguide 210 to produce an index of refraction change.

In some cases, such index of refraction changes can be patterned as a function of a length along the waveguide 210 to create specific frequency reflectors. The reflectors can be partial reflectors, full reflectors, or wavelength specific reflectors configured to allow certain wavelength(s) travel or transmit through such reflectors while reflecting a different wavelength(s). In some examples, the reflectors can be configured to produce a frequency shift specifically tuned to respond to temperature, pressure, torque, tension, a specific axial strain, etc.

In some examples, the refractive interfaces 302A-N, and thus index of refractive changes, can be designed over distances 304A-N by forming a layer structure(s) or thickness pattern(s) at one or more points along the waveguide 210. The structure(s) or pattern(s) can cause interference for certain frequencies of light which can cause a reflection of light at a specific wavelength. The magnitude of the index of refraction changes can cause weaker or stronger reflections. Moreover, the structure(s) or pattern(s) can be tuned to be more sensitive to pressure, torsion, tension, temperature, strain along a certain direction, etc. The different sensitivities can be used to infer or measure torsion, tension, strain, pressure, temperature, etc., based on the different sensitivities and the characteristics (e.g., frequency, intensity, etc.) of light scattered, reflected, and/or transmitted at the location of such structure(s) or pattern(s).

As previously noted, the refractive interfaces 302A-N can be implemented at certain distances 304A-N along the waveguide 210 and the drill pipes 108A-B. Such distances 304A-N can be used to identify the location of the refractive interfaces 302A-N. For example, if the drill pipes 108A-B are each 30 feet long and the refractive interfaces 302A-N are implemented at distance intervals of 10 feet along each drill pipe 108A-B, then the length of the drill pipes 108A-B and the distance intervals can be used to identify a location of each refractive interface 302A-N. The location of the coupling interface 306 can be similarly known based on the length of the drill pipes 108A-N. Thus, the distance and location of a refractive interface that produced any light reflections or scattering can be determined based on the known distance intervals of the refractive interfaces 302A-N. The refractive interfaces 302A-N can also be used as location or distance markers to extrapolate distance between refractive interfaces 302A-N.

If the location of a refractive interface is not known, then time and scattered or reflected light can be used to calculate the distance and location of such refractive interface. For example, the speed of light for the waveguide 210 can be used to calculate the distance and location of a refractive interface that reflected a transmitted beam of light or produced back scatter by timing a light signal transmitted and reflected or back scattered. The amount of time it takes the transmitted light signal to be reflected or back scattered divided by two in order to account for each direction (e.g., the transmitted direction and the return direction), can indicate the distance/location of the refractive interface that produced the reflection or back scatter. In this way, time can also be used to demarcate different distances, locations, and/or lengths along the waveguide 210.

In some examples, distance measurements associated with reflected or scattered light can be calibrated based on known locations of refractive interfaces 302A-N, frequency changes in reflection, a known location of pipe connections/joints (e.g., coupling interface 306) which can produce scattering, etc. In some examples, the refractive interfaces 302A-N can be patterned to have different frequency attenuation properties to identify a specific location or depth of a refractive interface. When a scattered or reflected light is received, the properties of the light can be analyzed to determine which refractive interface produced the scattered or reflected light. The location or distance of the refractive interface can be determined based on any known locations or distances of the refractive interfaces 302A-N and/or timing information as previously described.

The determined distance or location of a refractive interface can be used to calculate certain pipe and other conditions at the location of the refractive interface based on the characteristics of any scattering of light caused by the refractive interface. For example, changes in the intensity and/or frequency of scattered light can be used to calculate any strain, torque, tension, temperature, pressure, and/or other conditions at that location.

In some cases, scattering can be measured as a function of well depth to identify strain points on the drill pipes 108A-B. The strain points can be identified as a function of transmission loss. For example, a scatter center (e.g., refractive interface 302A, 302B, 302N) can reflect light but transmission across the scattering center can drop. Thus, if there is an increased amount of scattering (e.g., because of strain, damage, etc.) at one location, a certain amount of light will be lost on the other side of that location, as light will scatter out of the optical path (e.g., the waveguide 210). Thus, the transmission loss at that particular location can be measured or determined and used to identify any strain or damage at that particular location and well depth.

In some examples, corrosion, erosion, and/or gaps at a specific drill pipe (e.g., 108A and/or 108B) and/or at the waveguide 210 can be detected based on scattering patterns. For example, when there is corrosion, erosion, and/or gaps at a specific spot on a drill pipe (e.g., 108A, 108B) and/or the waveguide 210, the amount of back scatter will increase while the amount of light transmitted across that spot and along the waveguide 210 will decrease as a certain amount of light scatters out of the waveguide 210 without returning to the waveguide 210. An analysis of such back scatter and/or reduction in light transmitted across that spot and along the waveguide 210 can be used to infer any corrosion, erosion and/or gaps at that particular spot on the drill pipe and/or waveguide 210.

While FIG. 3 shows two drill pipes coupled together and used as a continuous waveguide, it should be noted that this is merely one illustrative example provided for explanation purposes. One of ordinary skill in the art will recognize that the concepts described here can be used in other implementations having only one drill pipe or more than two coupled drill pipes, tools, and/or other components. For example, in other implementations, more than two drill pipes can be coupled and used as a waveguide as described herein.

Moreover, while the optical waveguide 210 described herein is shown implemented in the context of drill pipes, one of ordinary skill in the art will recognize that the optical waveguide 210 and concepts herein can similarly be implemented on various other tools or components such as, for example and without limitation, a wellbore casing, a tubular or tubing or any other component suitable for implementing a sequence of low and high refractive-index layers to form a waveguide.

For example, in some cases, the waveguide 210 can be implemented or deposited in a casing. The casing can include a pipe lowered into a wellbore and cemented in place to stabilize the wellbore, protect certain formations, isolate formations, isolate a zone, prevent the flow of certain fluids, prevent a formation wall from caving into the wellbore, etc. The waveguide in the casing can be used to communicate data and/or measure or sense conditions such as, for example, temperature, one or more characteristics (e.g., a quality, a character, etc.) of cement bonds along the pipe casing, the flow of fluids and materials, etc.

For example, the waveguide 210 can be deployed on a casing by depositing low-high-low index of refraction layers on a surface of the casing, as previously described. Reflectors or scattering centers can also be deployed on the waveguide by embedding certain material at specific places along the waveguide and casing, locally melting a material on the waveguide to induce crystallization or glass at certain locations, building one or more layers or films of material into the structure of the casing, etching and masking, building a layered deposition onto the casing, etc. In some cases, one or more naturally occurring scattering centers can also be leveraged. The waveguide on the casing can be used to communicate data along the casing. Moreover, the reflectors or scattering centers can be used to detect conditions (e.g., temperature, cement bonds, flow, pressure, strain, etc.) along the casing, as previously noted.

In some cases, as previously mentioned, the waveguide and scattering centers or reflectors along the casing can be used to detect characteristics of cement bonds along the pipe casing. Reflected or scattered light can be measured and analyzed as previously described to detect things like temperature, pressure, strain, stress, etc. For example, an enhanced strain on a surface of the casing can indicate that a cement bond is strong, while a lower strain can indicate a weaker bond. Thus, the calculated strain can be used to infer characteristics of cement bonds along the casing.

The strain can be analyzed as a function of depth. Changes in the characteristics of reflected or scattered light can indicate the level of strain. For example, a level shift in the frequency of reflection in a scattering center or reflector center can be indicative of a certain amount of strain. When there is a poor cement bond, the reflected or scattered light can reflect a frequency change to a less strained configuration. Thus, the quality and character of bonds along the casing can be analyzed by detecting a level change in the frequency of reflection, and detecting a level change to a less strained configuration.

As another example, the waveguide 210 can be implemented in transmission/power lines and nuclear power applications to detect certain conditions.

For example, a waveguide can be deposited along a transmission line, and one or more scattering centers can be implemented at one or more locations on the waveguide. A pulse of light can be transmitted down the transmission line. If a sudden increase in scattering along the transmission line is detected, such increase in scattering can indicate damage on the transmission line. The back scatter can thus be analyzed to detect such condition and the distance/location of the condition can be determined by timing the distance.

To illustrate, if pulses of light are sent along the transmission line and an increased amount of scattering is detected relative to a previous or recent time, such increased amount of scattering can be used to infer that there has been some event (e.g., a spark, a break, etc.) which damaged the coating/waveguide on the transmission line and created the scattering. In some examples, a spark could damage the center coating of the waveguide and create a scattering center that would cause an increase in scattering at that location. Moreover, on the other side of that scattering center, the light could go dim or dark. Such scattering and reduction in light observed on the other side of the scattering center can thus indicate a spark has occurred that may have damaged the transmission line. If the transmission line is instead broken by some event, the break would create a very large scattering center and light would not travel to the other side of that scattering center, causing the other side to go dark. Damage at a certain location of the transmission line can thus be inferred based on any scattering detected, an increase in scattering with diming on the other side of a scattering center, and/or whether there is an increase in scattering with darkness observed on the other side of the scattering center.

Moreover, in a nuclear power application, a condition of the pipe in a nuclear power application can be inferred based on any back scattering observed when light is transmitted along a waveguide implemented on the pipe. Reflectors or scattering centers can be implemented on the waveguide along the pipe to detect any strain on any location along the pipe. For example, reflectors or scattering centers can be used to detect a large amount of strain on one side of a location on the pipe and a lower amount of strain on the other side. The reflected or scattered light can also be used to determine whether the pipe is becoming clogged, whether there is pressure building up on one side of the pipe versus another side of the pipe, etc. The information can also be used to infer where along the pipe there may be pressure, strain, torque, etc.

In some examples, the waveguide can be implemented in bridges, aerospace applications (e.g., air frames and bodies), and other bodies vulnerable to cyclical fatigue, in order to identify stressed materials and other conditions.

In other examples, the waveguide can be implemented on a pipe to detect seismic waves. For example, reflectors or scattering centers can be deployed on the waveguide, and such reflectors or scattering centers can be coated or patterned to be sensitive to a stress or strain. When acoustic waves pass over such reflectors or scattering centers, the wavelengths can interact with a material and cause stress and strain over that material. Thus, the natural properties of scattering centers on a waveguide, which are influenced by stress and strain, or specific reflectors, which can be designed to enhance the sensitivity to stress or strain, can be leveraged to measure a seismic wave and measure such changes over time. Seismic events would cause oscillation of the waves over time, which can be used to detect or measure such seismic events.

Figure 4:
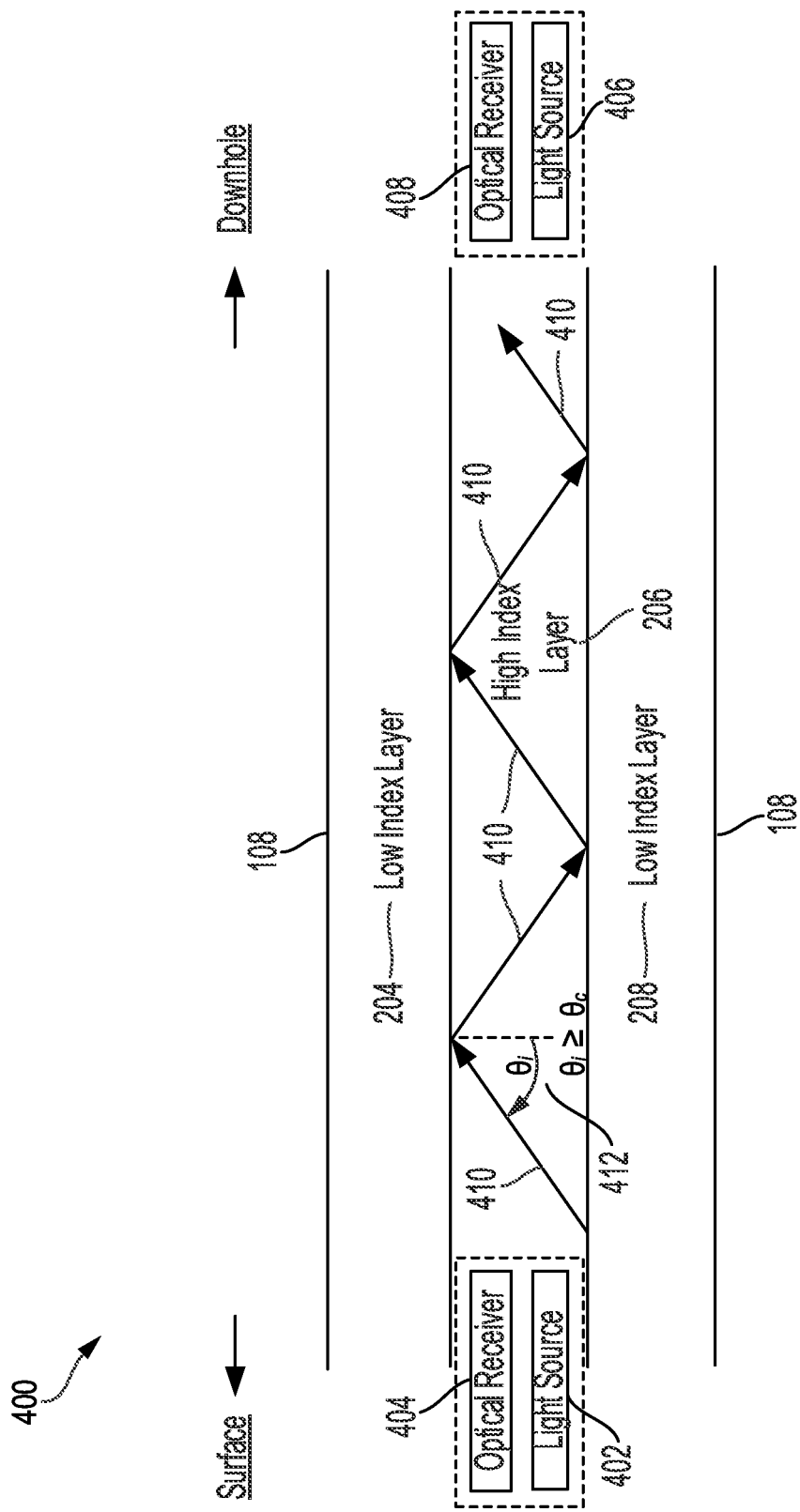
FIG. 4 is a diagram illustrating a light signal transmitted through an example configuration of an optical waveguide on an inner surface of a drill pipe, in accordance with some examples.

FIG. 4 is a diagram illustrating a light signal 410 transmitted through an example configuration 400 of an optical waveguide on an inner surface (e.g., 202) of a drill pipe 108. In this example, the light signal 410 is transmitted from a light source 402 on a surface location and propagated through the optical waveguide to an optical receiver 408 downhole. However, in other examples, the waveguide can be used to send the light signal 410 to and from other locations. For example, in some cases, a light signal can be similarly transmitted from a light source 406 downhole to an optical receiver 404 on the surface. In other examples, different light signals can be separately communicated (simultaneously or otherwise) between devices on the surface and downhole through different channels or different waveguides on the drill pipe 108.

The light sources 402 and 406 can include any light-emitting devices. For example, the light sources 402 and 406 can be light bulbs, lasers, LEDs, lamps, and/or any other device capable of emitting light signals. In some implementations, the light source 406 for transmitting light signals from a downhole location can include a carbon dioxide laser. Carbon dioxide lasers operate at high temperatures and can produce enough power to transmit light signals to the surface.

Moreover, each of the optical receivers 404 and 408 can include a detector such as, for example and without limitation, a photomultiplier tube (PMT), a photodiode, an avalanche photodiode, a photodetector or light sensor and/or the like. The optical receivers 404 and 408 can receive light signals and read optical information in the light signals; detect optical wave characteristics, which can be used to detect certain conditions (e.g., strain, torque, stress, temperature, pressure, fluids, substances, etc.); etc. The optical receivers 404 and 408 can convert the received light signals into electrical signals for use by electrical equipment such as computing devices, computer networks, etc.

In some examples, the optical receivers 404 and 408 can receive light signals and provide the light signals to a spectral analyzer, which can identify a spectroscopic fingerprint of the optical waves to identify certain conditions such as, for example, the presence and concentration of certain components that the light signal interacted with (e.g., water, oil, gas, butane, propane, methane, ethane, asphaltenes, corrosive materials, etc.), strain conditions, stress conditions, temperature, pressure, torque, etc. The spectral analyzer can be part of, or implemented by, the optical receivers 404 and 408 or implemented by one or more separate devices.

The optical receivers 404 and 408 can include additional components such as one or more amplifiers (e.g., a low-noise amplifier, lock-in amplifier, etc.), processing devices (e.g., processor, microcontroller, etc.), sensors (e.g., image sensor, voltage sensor, current sensor, transducer, etc.), signal conditioning circuitry (e.g., filter, isolation circuit, linearization circuit, etc.), a spectral analyzer, and so forth.

In some cases, the optical receivers 404 and 408 can improve a signal-to-noise ratio and/or can enhance a detection sensitivity using one or more methods such as, for example and without limitation, frequency selection (e.g., via notch or band filters), lock-in amplification (e.g., via a lock-in amplifier), isolation, etc. In some implementations, an optical receiver at or near the surface (e.g., optical receiver 404) can use isolation filters to isolate the detector from ambient light noise at or near the surface.

The optical waveguide used to carry the light signal 410 can include the layers 204-208 deposited on the inner surface (e.g., 202) of the drill pipe 108, as previously explained. The light signal 410 can be carried in the high index layer 206 through total internal reflection. For example, the light source 402 at the surface location can couple a light signal 410 of a given wavelength to the high index layer 206. The high index layer 206 can carry the light signal 410 through total internal reflection.

Total internal reflection occurs when the incident angle 412 ($\theta_i$) for the light signal 410 is greater or equal to the critical angle $\theta_c$ (e.g., angle of incidence that results in a refracted ray). For example, as the light signal 410 traveling through the high index layer 206 towards the boundary with the low index layer 204, which has a lower refractive-index value than the high index layer 206, the light signal 410 is totally internally reflected when the angle of incidence in the high index layer 206 reaches a certain critical value.

The reflected light signal 410 continues to travel through the high index layer 206 towards the boundary with the low index layer 208, which also has a lower refractive-index value than the high index layer 206. The light signal 410 is again totally internally reflected when the angle of incidence in the high index layer 206 reaches a certain critical value. The light signal 410 can continue to travel in this manner within the high index layer 206 until it reaches the optical receiver 408.

The optical receiver 408 can receive the light signal 410, extract optical information in the light signal 410 and/or detect one or more characteristics of the optical waves such as a spectroscopic fingerprint as previously noted. Moreover, in some examples, the optical receiver 408 can convert the light signal 410 into a format, such as an electrical signal, suitable for a computing device or network.

The light source 406 at the downhole location can similarly send light signals toward a surface location. For example, the light source 406 can generate a light signal and similarly propagate the light signal through the high index layer 206 to the optical receiver 404. In some implementations, the light sources 402 and 406 can use different frequencies of light for downhole communications and uphole communications to create different channels of communication.

For example, the light source 402 can use a specific frequency of light to transmit light signals (e.g., 410) to the optical receiver 408 at the downhole location, and the light source 406 at the downhole location can use a different frequency of light to transmit light signals to the optical receiver 404 at or near the surface location.

In some implementations, the wavelength of light signals transmitted from or near the surface can be selected to avoid significant interference from ambient light conditions (e.g., UV-VIS radiation). For example, the light source 402 at or near the surface can send light signals (e.g., 410) downhole having a wavelength at near or mid infrared radiation wavelength ranges to avoid inference with UV-A, UV-B, or UV-C light from the surface.

In some examples, the optical waveguide (e.g., layers 204-208) can be used to communicate (e.g., via light signals) various types of data to the surface and/or a downhole location such as a bottom hole assembly. For example, the optical waveguide can be used to communicate directional-drilling or MWD measurements such as wellbore trajectory measurements (e.g., inclination and azimuth); data from one or more sensors (e.g., accelerometers, magnetometers, gyroscopes, pressure sensors, temperature sensors, etc.) such as, for example, tool face measurements, rock formation measurements (e.g., density, porosity, pressure, etc.), rock fluid pressures, temperature measurements, torque and weight on bit measurements, rotational speed of drill bit, mud flow volume, etc.; wellbore survey data; geo-steering commands; etc.

Figure 5A:
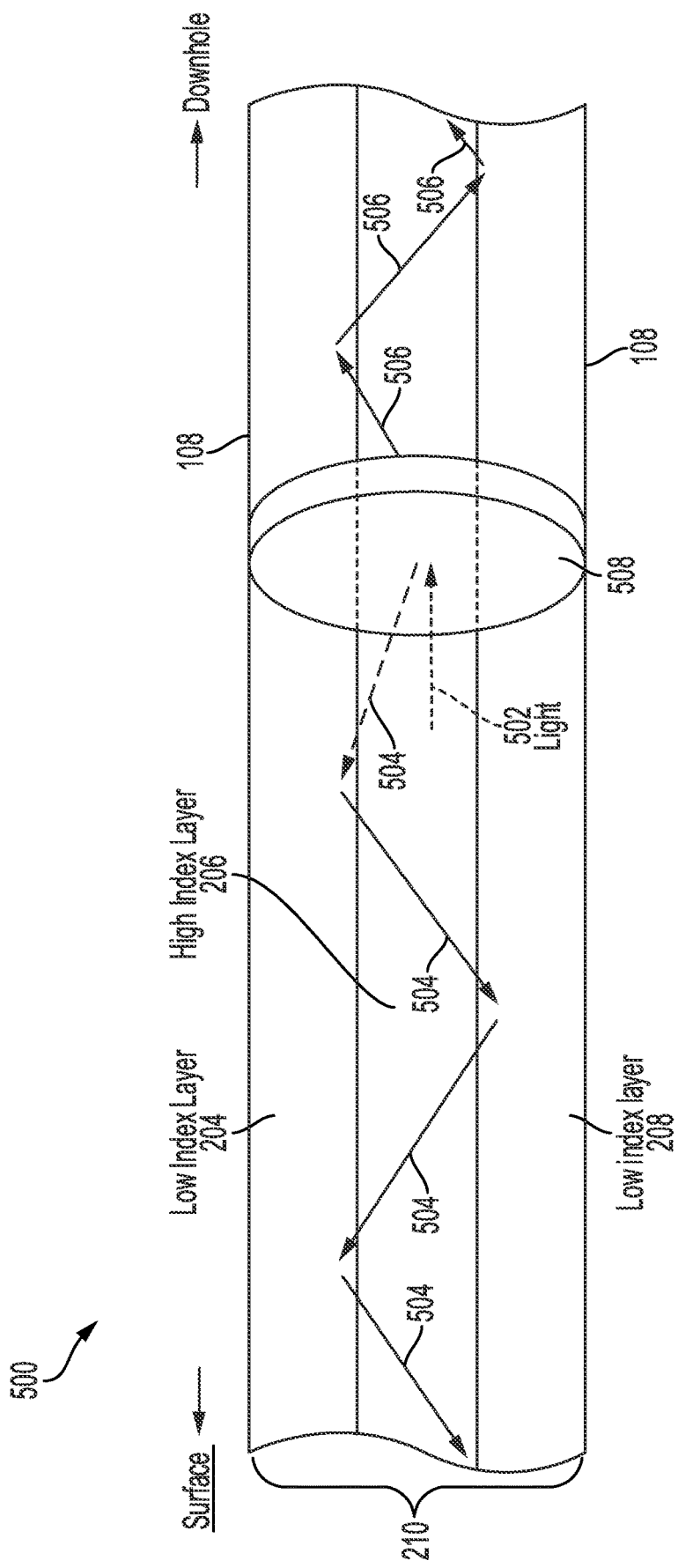
FIG. 5A is a diagram illustrating a light beam transmitted through an example configuration of an optical waveguide having a partial reflector, in accordance with some examples.

FIG. 5A is a diagram illustrating a light beam 502 transmitted through an example configuration 500 of an optical waveguide 210 having a partial reflector 508. In this example, the high index layer 206 of the waveguide 210 is shown carrying the light beam 502 towards the partial reflector 508.

The partial reflector 508 can send light that interacts/interfaces with the partial reflector 508 in different directions. For example, the partial reflector 508 can reflect light backwards and propagate/transmit light forwards. Thus, when the light beam 502 interacts/interfaces with the partial reflector 508, the partial reflector 508 can split the light beam 502 into reflected light 504 and propagated light 506.

The reflected light 504 can travel along the waveguide 210 back in the opposite direction that the light beam 502 traveled prior to interacting/interfacing with the partial reflector 508. Thus, the partial reflector 508 can return the reflected light 504 towards the origin or source of the light beam 502. A receiver (e.g., 404) can receive the reflected light 504 and analyze the reflected light 504 (or send the reflected light 504 to another device for analysis) to detect or measure conditions/characteristics at the drill pipe 108, as previously explained.

On the other hand, the propagated light 506 can continue to travel along the waveguide 210 in/towards a same direction as the light beam 502. Thus, the partial reflector 508 can allow the propagated light 506 to travel forward or towards a same/similar direction as the incoming light beam 502. In some cases, a receiver (e.g., 408) can receive the propagated light 506 and analyze the propagated light 506 (or send the propagated light 506 to another device for analysis) to detect or measure conditions/characteristics at the drill pipe 108 (e.g., at one or more portions/segments of the drill pipe 108 located after the partial reflector 508), as previously explained.

In some cases, the partial reflector 508 can be configured to be sensitive to one or more specific conditions (e.g., pressure, temperature, torsion, tension, strain, etc.) and/or wavelengths. The specific sensitivity or sensitivities of the partial reflector 508 can be used to infer or measure certain conditions such as torsion, tension, strain, pressure, temperature, etc., based on the specific sensitivity or sensitivities and the characteristics (e.g., frequency, intensity, etc.) of the reflected light 504 and/or the propagated light 506.

Figure 5B:
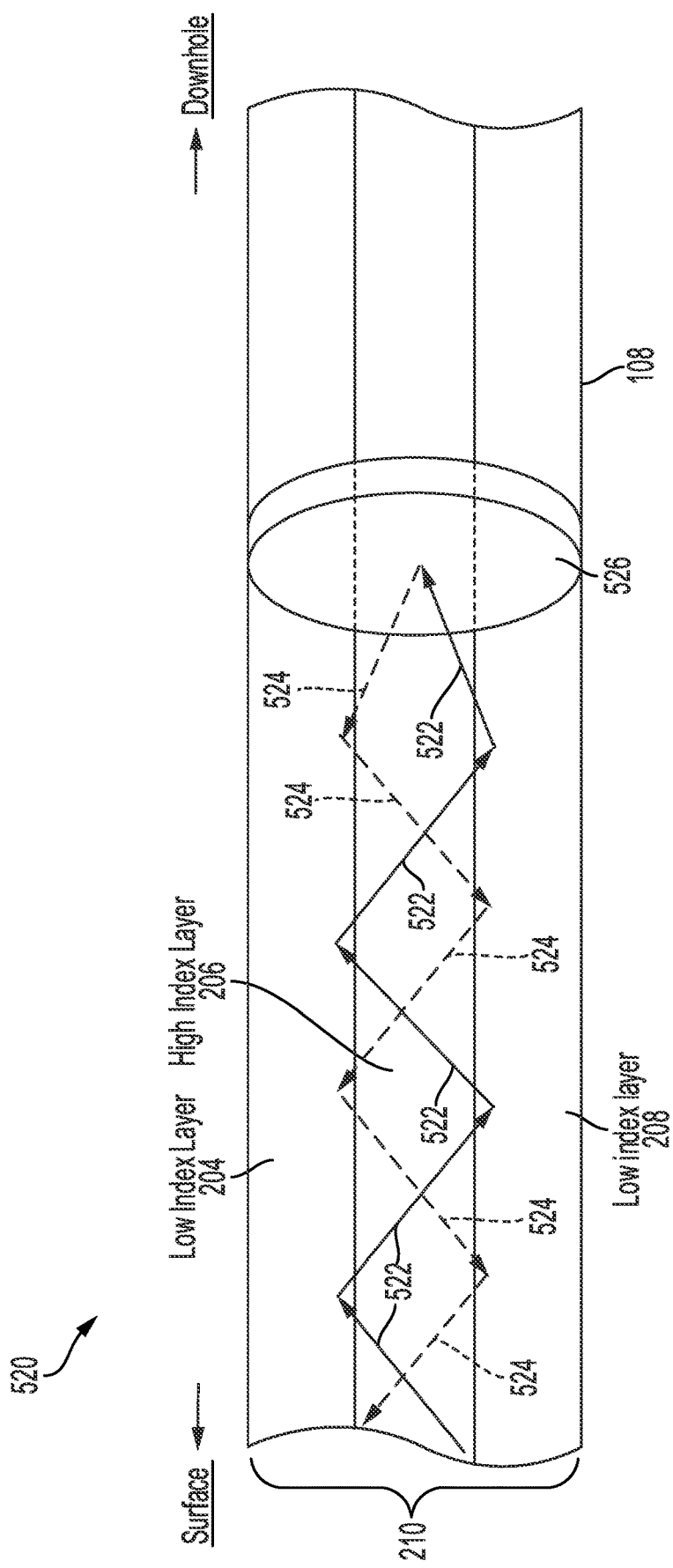
FIG. 5B is a diagram illustrating a light beam transmitted through an example configuration of an optical waveguide having a full reflector, in accordance with some examples.

FIG. 5B is a diagram illustrating a light beam 522 transmitted through an example configuration 520 of an optical waveguide 210 having a full reflector 526. In this example, the high index layer 206 of the waveguide 210 is shown carrying the light beam 522 towards the full reflector 526.

The full reflector 526 can reflect light that interacts/interfaces with the full reflector 526 backwards. Thus, when the light beam 522 interacts/interfaces with the full reflector 526, the full reflector 526 can send reflected light 524 backwards. The reflected light 524 can travel along the waveguide 210 back in the opposite direction that the light beam 502 traveled prior to interacting/interfacing with the full reflector 526. Therefore, the full reflector 526 can return the reflected light 524 towards the origin or source of the light beam 522.

A receiver (e.g., 404) can receive the reflected light 524 and analyze the reflected light 524 (or send the reflected light 524 to another device for analysis) to detect or measure conditions/characteristics at the drill pipe 108, as previously explained. In some cases, the full reflector 526 can be configured to be sensitive to one or more specific conditions (e.g., pressure, temperature, torsion, tension, strain, etc.) and/or wavelengths. The specific sensitivity or sensitivities of the full reflector 526 can be used to infer or measure certain conditions such as torsion, tension, strain, pressure, temperature, etc., based on the specific sensitivity or sensitivities and the characteristics (e.g., frequency, intensity, etc.) of the reflected light 524.

FIG. 5C is a diagram illustrating a light beam 542 transmitted through an example configuration 540 of an optical waveguide 210 having a scattering center 546. The scattering center 546 can be naturally occurring (e.g., based on a naturally occurring material inhomogeneity or defect), constructed into the drill pipe 108 (e.g., a pattern or structure built into the drill pipe 108), induced by modifying one or more characteristics (e.g., a material, a pattern/structure, etc.) of the waveguide 210 at a specific location, etc. For example, the scattering center 546 can be created by shooting a location/region of the waveguide 210 where the scattering center 546 is to be located with a laser to make a defect/inhomogeneity on the waveguide 210 at that particular location/region or cause local melting and resolidification of a material on the waveguide 210 at that particular location/region.

In FIG. 5C, the high index layer 206 of the waveguide 210 is shown carrying the light beam 542 towards the scattering center 546. When the light beam 542 interfaces/interacts with the scattering center 546, light waves 544A-N from the light beam 542 are scattered in different directions. In this example, light 544A is scattered backwards and light 544N is scattered forwards. However, one of ordinary skill in the art will recognize that in other examples, the light waves can be scattered in any other direction(s) and/or combination of directions.

The light 544A scattered backwards can travel backwards along the high index layer 206 and the light 544N scattered forwards can travel forwards along the high index layer 206. In some examples, a detector (e.g., 404) can be implemented to receive the light 544A scattered backwards and analyze the light 544A (e.g., the wavelength, intensity, spectroscopic fingerprint, time/distance, etc.) to identify one or more characteristics or conditions (e.g., strain, torque, stress, temperature, pressure, fluids/gasses/substances/materials, etc.) at or within the drill pipe 108 (e.g., at the scattering center 546 and/or before the scattering center 546), as previously explained.

Similarly, in some examples, a detector (e.g., 408) can be implemented to receive the light 544N scattered forwards and analyze the light 544N (e.g., the wavelength, intensity, spectroscopic fingerprint, time/distance, etc.) to identify one or more characteristics or conditions (e.g., strain, torque, stress, temperature, pressure, fluids/gasses/substances/materials, etc.) at or within the drill pipe 108 (e.g., at the scattering center 546 and/or after the scattering center 546), as previously explained.

Figure 6:
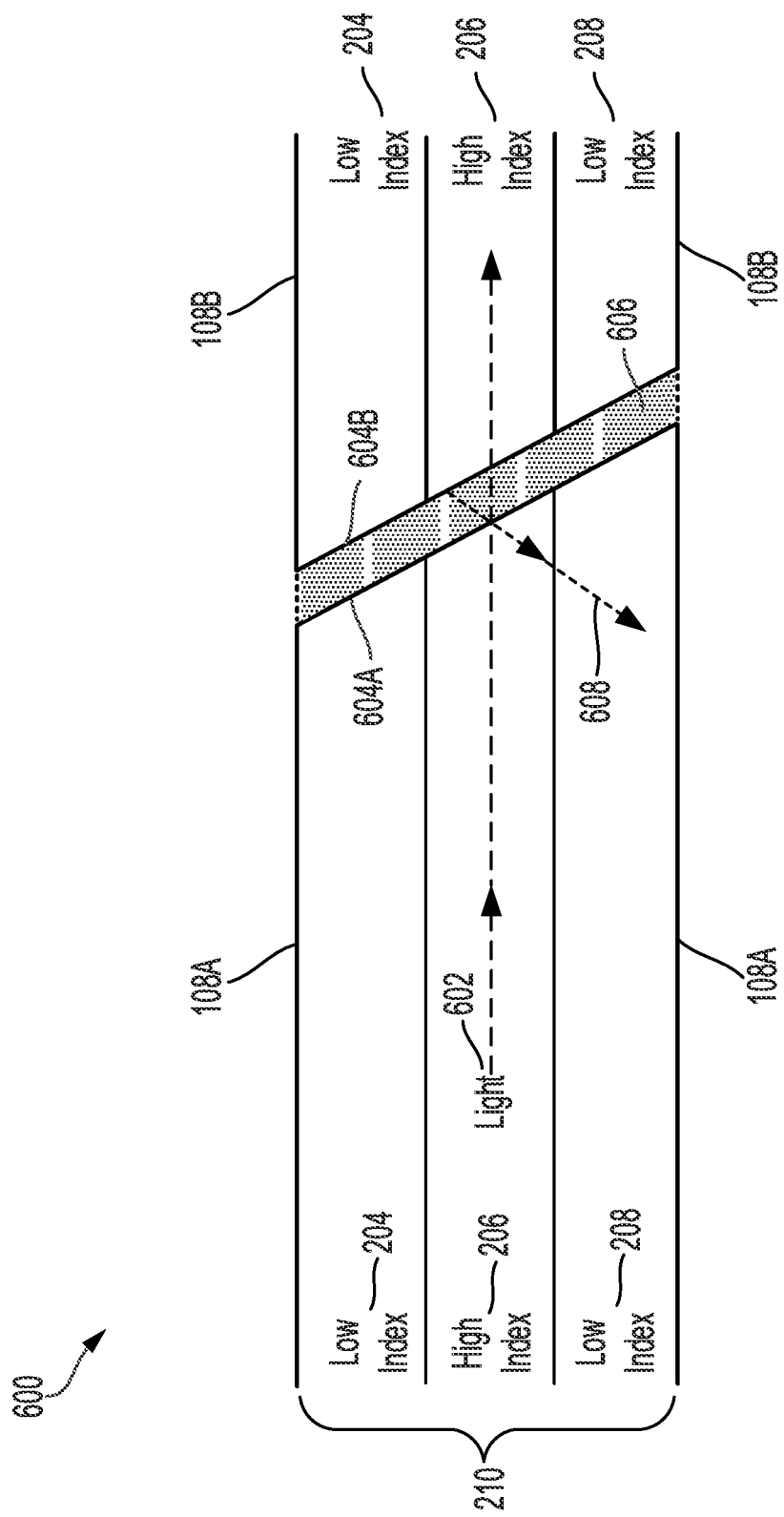
FIG. 6 is a diagram illustrating an example configuration of an optical waveguide implemented across two coupled drill pipes, in accordance with some examples.

FIG. 6 illustrates an example configuration 600 of an optical waveguide 210 (e.g., layers 204, 206, 208) implemented across two coupled drill pipes 108A-B. In this example, drill pipe 108A and drill pipe 108B are coupled together via coupling interfaces 604A-B. The coupling interfaces 604A-B can include a coupling mechanism such as a joint, for example. In some examples, the coupling interfaces 604A-B can be coated with a jointing layer 606 designed to minimize optical transmission loss through the coupling interfaces 604A-B and the jointing layer 606.

In some cases, the jointing layer 606 can be an index-matching layer of a high refractory-index material. The high refractory-index material in the jointing layer 606 can improve coupling between the surfaces of the two drill pipes 108A-B and increase transmission probability. Moreover, in some implementations, the coupling surface (e.g., jointing layer 606) between the two drill pipes 108A-B can be shaped as a mating beveled surface to increase coupling between the drill pipes 108A-B.

To prevent or limit light 602 propagated by the high index layer 206 from reflecting back within the high index layer 206 when the light 602 reaches the coupling interfaces 604A-B, which can cause interference and signal loss, the coupling interfaces 604A-B and jointing layer 606 can be configured in a particular angle so the coupling interfaces 604A-B are parallel (or substantially parallel) to each other. For example, the coupling interfaces 604A-B can be angled in parallel in a configuration similar to a parallelogram.

The particular, parallel angles of the coupling interfaces 604A-B can cause any light reflection 608 to have an angle of incidence (e.g., relative to the critical angle) that causes the light reflection 608 to be propagated into the low index layer 208. This can prevent back reflection into the high index layer 206, thus reducing or eliminating potential interference and loss due to such back reflection.

The light 602 that is not reflected into the low index layer 208 can travel through the high index layer 206 and the jointing layer 606 via total internal reflection. The light 602 can then continue to travel through the high index layer 206 in the second drill pipe 108B. If the second drill pipe 108B is coupled to another component, such as another drill pipe, the light 602 can travel through a similar coupling between them, which can have an index-matching surface layer as described herein, and continue to travel through a high index layer in the coupled component until it reaches its destination (e.g., a receiving device such as a detector).

In some examples, the jointing layer 606 can be configured to have certain sensitivities (e.g., wavelength, temperature, pressure, strain, torque, stress, etc.) as previously explained. Moreover, the jointing layer 606 can be configured to have certain reflection/scattering characteristics (e.g., partially reflecting, fully reflecting, etc.), as previously described. Such different configurations can be implemented to allow the jointing layer 606 to function as a reflector or scattering center. In some cases, light reflected from the coupling interfaces 604A-B can be analyzed to identify the optimal torque for coupling the drill pipes 108A-B.

While FIG. 6 shows two drill pipes coupled together and used as a continuous waveguide, it should be noted that this is merely one illustrative example provided for explanation purposes. One of ordinary skill in the art will recognize that the concepts described here can be used in other implementations having more than two coupled drill pipes, tools, and/or other components. For example, in other implementations, more than two drill pipes can be coupled and used as a waveguide as described herein.

Moreover, while the optical waveguide described in FIGS. 2 through 6 is shown implemented in a drill pipe, one of ordinary skill in the art will recognize that the optical waveguide and concepts herein can similarly be implemented on various other tools or components such as, for example and without limitation, a casing, a tubular or tubing, a power line, and/or any other component suitable for implementing a sequence of low and high refractive-index layers to form a waveguide.

Figure 7:
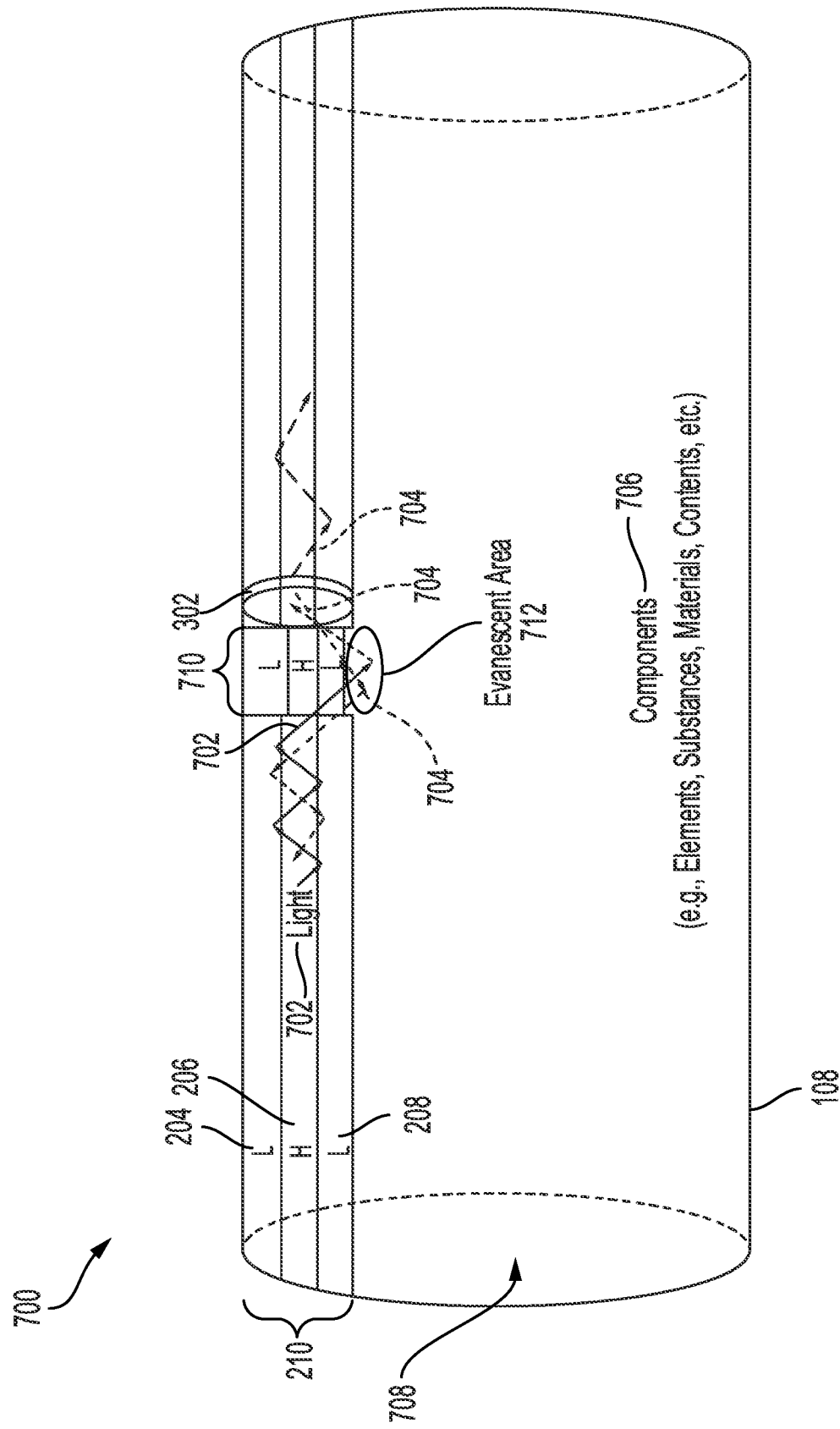
FIG. 7 is a diagram illustrating an example configuration of an optical waveguide for use in evanescent wave sensing applications, in accordance with some examples.

FIG. 7 illustrates an example configuration 700 of the optical waveguide 210 for use in evanescent wave sensing applications. Evanescence is a process by which energy (e.g., light 702) coupled to a medium (e.g., waveguide 210) extends beyond the medium in which the energy is coupled to (e.g., the waveguide 210). For example, typically, when there is total internal reflection at a boundary between a high index medium (e.g., 206) and a low index medium (e.g., 204 or 208) with a light beam (e.g., 702) incident from the high index side of the boundary, there is generally no (or little) energy propagation in the low index medium. However, there can generally be an evanescent field in the low index medium in a space of the order of the wavelength. Thus, if there is another medium, material, substance, etc., on the other side of the low index medium (e.g., opposite to the high index medium) that is within the range of the evanescent field, then an attenuated light beam can be transmitted into that other medium, material, substance, etc.

For example, if light 702 is transmitted through the high index layer 206 of the waveguide 210, the light 702 can generally be propagated within the high index layer 206. However, in FIG. 7, through evanescence, when the light 702 interfaces with the evanescent interaction region 710 of the waveguide 210 on the drill pipe 108, evanescent light 704 can extend beyond the high index layer 206 and the low index layer 208 in the evanescent interaction region 710 and can interact with components (e.g., substances, materials, environment, objects, etc.) in an evanescent area 712 in an inside 708 of the drill pipe 108.

The evanescent area 712 can include one or more components 706. The one or more components 706 can include, for example, a medium, one or more elements, one or more materials, one or more objects, one or more substances, etc. To illustrate, the one or more components 706 can include, for example and without limitation, air, water, oil, gas, a wax formation, methane, ethane, propane, butane, asphaltenes, corrosive materials, and/or any other material, substance, chemical, etc. The one or more components 706 and/or energy loss from the evanescence process can modify certain characteristics of the evanescent light 704 (e.g., intensity, wavelength, spectroscopic fingerprint, etc.), which can be analyzed to determine one or more conditions/characteristics associated with the one or more components 706. For example, a spectral analyzer can analyze properties of the evanescent light 704 to determine the presence and/or concentration of various components/materials, such as the one or more components 706.

In some cases, evanescence can be enhanced by making the evanescent interaction region 710 of the waveguide 210 (and/or the high index layer 206 and the low index layer 208 within the evanescent interaction region 710) thinner than the wavelength of the light 702. For example, if the thickness of the high index layer 206 at the evanescent interaction region 710 is 500 nanometers and the wavelength of the light 702 is 1.6 microns, a significant portion of the energy of the light 702 traveling along the evanescent interaction region 710 of the waveguide 210 can exist outside of, or extend beyond, the high index layer 206 in the evanescent interaction region 710 and can interact with anything that is on the outside of the high index layer 206. If the high index layer 206 and the low index layer 208 in the evanescent interaction region 710 are together thinner than the wavelength of the light 702, the energy of the light 702 (e.g., the evanescent light 704) will not only extend beyond the high index layer 206 but will also extend beyond the low index layer 208 in the evanescent interaction region 710 and interact with anything (e.g., one or more components 706) on the outside of the waveguide 210 (e.g., on the evanescent area 712 in the inside 708 of the drill pipe 108) along the light path.

In the example configuration 700 shown in FIG. 7, the high index layer 206 and the low index layer 208 are configured to be thinner than the wavelength of the light 702 in order to enhance evanescence of the light 702 and allow the evanescent light 704 to extend beyond the low index layer 208 of the waveguide 210 and interact with the evanescent area 712 and/or one or more components 706 in the evanescent area 712. To avoid too much attenuation of light at the evanescent interaction region 710 and the evanescent area 712, the interaction length (e.g., the length of the evanescent interaction region 710) can be reduced, as longer lengths can cause too much attenuation of light through evanescence.

The evanescent light 704 can be used to detect any materials/substances and/or conditions on the other side of the low index layer 208 (e.g., the side opposite to the high index layer 206) in the evanescent interaction region 710. In some cases, the low index layer 204 adjacent to the drill pipe 108 can be made sufficiently thick to avoid any energy of the light 702 from extending to or coupling to the drill pipe 108. For example, if evanescence is being used to detect conditions and/or materials/substances on the outside of the waveguide 210 and within the inside 708 of the drill pipe 108, without also detecting conditions of the drill pipe 108 (and/or without causing the evanescent light 704 from interacting with the drill pipe 108), then the low index layer 204 adjacent to an inner portion of the drill pipe 108 can be configured with sufficient thickness to avoid the energy of the light 702 from extending beyond the low index layer 204 and interacting with the drill pipe 108. Thus, a thicker film/material can be used for the low index layer 204 to decouple potential energy loss through evanescent waves and/or prevent light carried by the high index layer 206 from extending beyond the high index layer 206 and the low index layer 204 and interacting with the drill pipe 108 (for example if the high index layer 206 and low index layer 204 are thinner than the wavelength of the light carried).

To illustrate, in the example configuration 700, the low index layer 204 at the evanescent interaction region 710 can be configured to be thick enough to prevent the energy of the light 702 from extending beyond the low index layer 204 and interacting with the drill pipe 108. At the same time, the high index layer 206 and low index layer 208 adjacent to the low index layer 204 at the evanescent interaction region 710 can be configured to be thinner than the wavelength of the light 702 so, through evanescence, the evanescent light 704 is extended beyond the high index layer 206 and the low index layer 208 at the evanescent interaction region 710. This will allow the evanescent light 704 to interact with anything at the evanescent area 712 on the inside 708 of the drill pipe 108. The evanescent light 704 can thus interact evanescently with any components (e.g., 706) at the evanescent area 712 on the inside 708 of the drill pipe 108. Such interaction can then be used to sense any conditions and/or components 706 at the evanescent area 712 on the inside 708 of the drill pipe 108.

In some examples, a reflector 302 can be implemented along the waveguide 210 on the opposite side (e.g., relative to the incoming or incident light) of the evanescent interaction region 710 to fully or partially reflect the evanescent light 704 backwards and/or forwards. For example, a partial reflector 302 can be implemented to reflect a portion of the evanescent light 704 backwards and allow another portion of the evanescent light 704 to be propagated along the waveguide 210 after traversing the evanescent interaction region 710 and the partial reflector 302. In this example, when the evanescent light 704 crosses the evanescent interaction region 710 and hits the partial reflector 302, a portion of the evanescent light 704 can be reflected backwards towards the direction the light 702 originated from and another portion of the evanescent light 704 can continue traveling forwards along the waveguide 210. Accordingly, in this example, light will travel twice through the evanescent interaction region 710: once when the light crosses the evanescent interaction region 710 and hits the reflector 302, and a second time when the reflected light crosses the evanescent interaction region 710 upon backwards reflection.

The reflected evanescent light 704 can then be received by a detector device and analyzed to identify any substances and/or conditions on the inside 708 of the drill pipe 108. In some cases, the transmitted evanescent light 704 that was propagated forward by the reflector 302 can similarly be received by a detector device and analyzed to identify any substances and/or conditions. The evanescent light 704 can thus be analyzed in order to spectroscopically characterize any components 706 that the evanescent light 704 came in contact with at the evanescent area 712.

For example, water is transparent in the visible light range, but highly absorbing in the infrared (IR) light spectrum. On the other hand, oil is very absorbing in the visible light spectrum, but very transparent in the IR spectrum. Thus, using water and oil as example substances that can be detected by analyzing the evanescent light 704, if the evanescent light 704 travels across the evanescent interaction region twice as previously described and the returned light has a significant amount of visible light but the IR light has been significantly attenuated, then it can be inferred based on the amount of visible and IR light that the substance in the evanescent area 712 that the light came in contact with is water. In some examples, the amount of water can also be calculated based on the relative ratio of visible and IR light between the first pass of light through the evanescent interaction region 710 and the second pass. If, on the other hand, the evanescent light 704 includes a significant amount of IR light and little visible light, then it can be inferred that the substance in the evanescent area 712 that the light came in contact with is oil, and the amount of oil can similarly be estimated based on the relative distribution of that light.

Other substances and components can also be detected based on the spectroscopic fingerprint of the evanescent light 704. For example, to measure a component in oil detected at the evanescent area 712, a spectroscopic fingerprint of the light (e.g., or a pattern as a function of the wavelength of light) can be analyzed to detect and measure such a component in the oil. The composite signature that is returned from the reflector 302 can be analyzed to detect a particular pattern associated with the component in oil. To illustrate, the returned light can be passed through a spectral analyzer and a mathematical computation can be performed on the particular light spectrum to determine the presence and/or concentration of various components such as water, oil, methane, ethane, propane, butane, asphaltenes, corrosive materials like carbon dioxide ($CO_2$), hydrogen sulfide ($H_2S$), etc. The light can be analyzed to determine a type of substance and the chemistry of that substance using an evanescent wave interaction as described herein.

In some cases, multiple evanescent interaction regions (e.g., 710) can be configured on the waveguide 210 at different locations/distances to detect/measure substances/conditions at different locations/distances. For example, assume that a different evanescent interaction region is configured on the waveguide 210 at every 10 drill pipes or every 300 feet. Here, when the light 702 is transmitted through the waveguide 210, the light will hit a first evanescent interaction spot, and measurement can be obtained based on the evanescent wave interaction at that first evanescent interaction spot. The second evanescent interaction spot can be a composite of the first and second evanescent interaction spots. Thus, the influence of the first evanescent interaction spot on the light can be subtracted from the measurement at the second evanescent interaction spot to determine the influence at the second evanescent interaction spot. Similarly, the influence of the next evanescent interaction spot can be determined by subtracting the influence of the first and second evanescent interaction spots from the measurement at the next evanescent interaction spot. This measurement and detection strategy can be used to make specific evanescent wave interaction measurements at different locations/distances along one or more drill pipes, and detect/measure one or more substances and/or conditions at those specific locations/distances.

In some examples, smaller evanescent interaction spots (e.g., 710) can be configured on a drill pipe 108 to obtain very localized measurements. For example, assume the drill pipe 108 is 10 inches in circumference. Thus, the outer surface of the drill pipe 108 in this example is 10 inches long. A very localized evanescent wave interaction spot can then be configured within a portion of the circumference of the drill pipe 108 at a specific location. For example, an evanescent wave interaction spot that is ⅛ of an inch around the circumference of the drill pipe 108 can be configured at a specific location along the drill pipe 108. If a full reflector is then placed/implemented behind that ⅛ of an inch evanescent wave interaction spot, then all of the light that passes through that evanescent wave interaction spot will be reflected back and none of the interacted light will transmit to the next location. The reflected light can then be analyzed to identify any substance(s) or conditions at that small portion of the drill pipe 108 where the evanescent wave interaction spot was implemented.

In some examples, one or more evanescent wave interaction regions and one or more reflectors can be distributed along around the drill pipe over a narrow portion of the drill pipe. For example, assume a ⅛ of an inch evanescent wave interaction region and a full or partial reflector are implemented at four different locations around the drill pipe. Each reflector can be configured specifically for the respective location of the evanescent wave interaction region associated with the reflector. For instance, a particular location after an evanescent wave interaction region can be coated to form a full reflector for one or more light patterns with the exception of a very specific pattern that is outside of a spectroscopic region of interest. Here, when the light is reflected back after crossing that particular evanescent wave interaction region and being reflected by the full reflector, the specific location and evanescent wave interaction region where the reflected light came from can be estimated based on the reflected light (e.g., based on the properties of the reflected light, the time it took for the reflected light to be received after the light was transmitted towards the evanescent wave interaction spot and full reflector, etc.). The reflected light can also be analyzed as previously explained to identify/measure any substances at that particular location.

In some cases, the evanescent wave interaction features described herein can be implemented to detect and/or measure various other conditions or factors in a wellbore environment. For example, in some implementations, evanescence as described herein can be used to perform horizontal detection of materials (e.g., gas, water, oil, etc.) in a wellbore, such as detection of materials in horizontal sections of the wellbore before surface migration. To illustrate, the leaking or reflection of light through the waveguide 210 can be enhanced by adjusting the index of refraction and/or the thickness of one or more layers of the waveguide 210. The index of refraction of the layers of the waveguide 210 relative to the index of refraction of any substance or material on the other side of the waveguide 210 (e.g., adjacent to low index layer 208 on a side of low index layer 208 opposite to high index layer 206) can dictate whether light from the waveguide 210 will be totally internally reflected and retained within the waveguide 210 when interacting with the substance or material on the other side of the waveguide 210 or otherwise leaked out of the waveguide 210 onto the substance or material on the other side of the waveguide 210.

Thus, based on the index of refraction of the substance or material on the other side of the waveguide 210, the configuration of the waveguide 210 can cause the light 702 to leak out of the waveguide 210 and onto that substance or material or to be retained within the waveguide 210. To enable and/or enhance evanescent wave interaction, the high index layer 206 and/or the low index layer 208 can be made thinner at a particular area of interest as previously explained. The leaking of the light 702 and/or the reflection of the light 702 caused by the evanescent wave interaction can be analyzed to detect materials and/or conditions in the drill pipe 108, such as gas, air, fluids (e.g., water, oil, etc.), gas bubbles, etc.

In another example, evanescence as described herein can be used to detect pressure, volume, temperature (PVT) cells, which can be used to detect gas bubbles forming in the wellbore and where such gas bubbles are forming. This detection of gas bubbles forming can be used for early detection of a gas kick (e.g., a gas influx). At lower depths in the wellbore, the pressure may be high enough that gas dissolved in a fluid can remain dissolved in the fluid. However, as the fluid travels up the wellbore to lower depths and closer to the surface, the pressure starts to decrease and can eventually cause the fluid to burst into two phases: gas and fluid. This burst can cause a potentially dangerous gas kick. Thus, the evanescence techniques can be used to detect any gas kicks building and/or a burst point, which can be then used to take action to prevent such gas kicks such as by increasing the pressure of the fluid in the wellbore, increasing the mud weight downhole, slowing down the rate of penetration/drilling to reduce the influx of gas, etc.

To illustrate, certain areas/regions of the waveguide 210 can be designed to enhance evanescent wave interaction (e.g., by designing one or more layers to be sufficiently thin to allow or enhance evanescent wave interaction) at those areas/regions of the waveguide 210. The evanescent wave interaction can then be used to monitor PVT as well as the relative amounts of oil, gas and water in the wellbore (e.g., by analyzing light leakage/attenuation/intensity at the evanescent wave interaction regions, analyzing characteristics (e.g., wavelength, intensity, spectroscopic fingerprint, etc.) of reflected light, etc.). This information can be used to detect gas bubble formations, the location of such gas bubble formations, etc., in order to provide early detection of gas kicks.

Such evanescent wave interaction techniques can also be used to detect where water in the wellbore is coming from and going to. Water can sometimes come out of one zone (e.g., zone 1) and rise to the surface. The water can in some cases be consequently carried along with production operations. In other scenarios, water can come out of a zone (e.g., zone 1) and drizzle down into another zone (e.g., zone 2). When a gas kick is developing, microbubbles can come out of solution near the drill bit. The microbubbles can go back into solution or can be disbursed, but the developing microbubbles can indicate that the amount of gas developing in the system is too much or reaching dangerous levels, and certain actions as previously described can then be taken to prevent a gas kick or further formation of bubbles.

In other examples, evanescence as described herein can be used to measure pump efficiency. Often times, when pumps pump fluid most effectively, they do not pump gas very effectively. To increase pumping efficiency/effectiveness, the pump can be operated at a certain speed that can prevent the fluid from breaking into two phases because when the fluid breaks into two phases, the pump stops pumping fluid and instead works to expand and contract a gas on the pump cycle. This is often referred to as vapor lock. The evanescence techniques herein can be used to provide an independent flow measurement to ensure that the pump is actually moving fluid. One way to detect the effectiveness of the pump is to detect whether the fluid is breaking into two phases using the waveguide 210 to cause evanescence wave interactions. If the evanescence wave interactions indicate that the fluid is breaking into two phases, this can indicate that the pumping rate is too high or that the pumping pressure differential is too high and should be decreased (e.g., by slowing down the pump).

In yet other examples, evanescent wave interactions can be used to detect mud and/or air gaps in the cementing process when creating the casing (e.g., 116) of the wellbore. For example, loss of light through evanescent wave interaction can indicate that there is mud, air, and/or cement behind a bond. Thus, evanescent wave interactions can be configured at localized areas to detect such gaps in air, mud, and/or cement.

Figure 8:
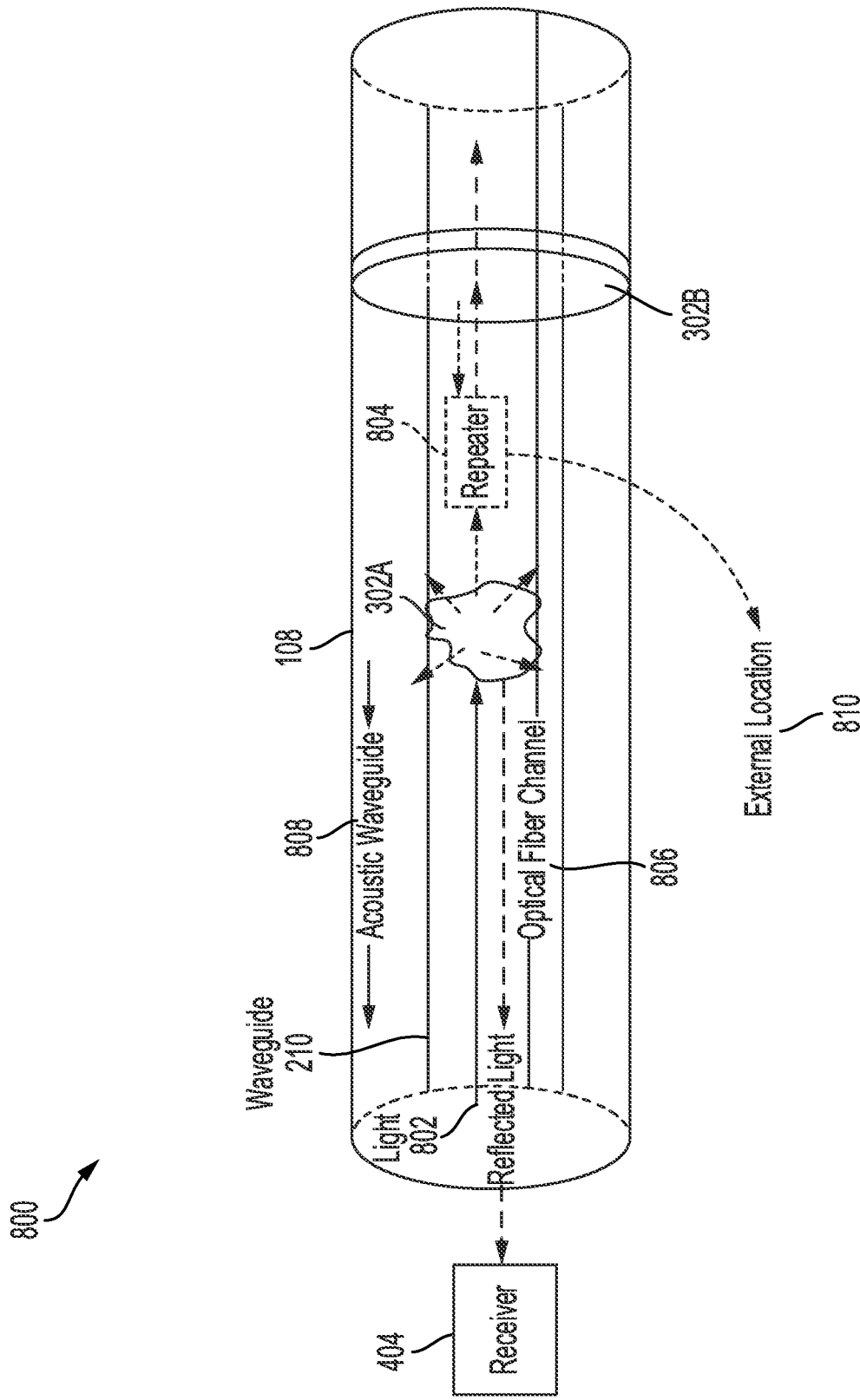
FIG. 8 is a diagram illustrating an example configuration of a drill pipe including multiple communication channels and a repeater to boost signals carried by an optical waveguide, in accordance with some examples.

FIG. 8 illustrates an example configuration 800 of the drill pipe 108 including multiple communication channels and a repeater 804 to boost signals carried by the optical waveguide 210. In this example, the multiple communication channels can include the optical waveguide 210, an optical fiber channel 806, and an acoustic waveguide 808. It should be noted that the optical fiber channel 806 and acoustic waveguide 808 are provided herein as non-limiting examples for clarity and explanation purposes. One of skill in the art will recognize that in other examples, the multiple communication channels can include more or less channels than shown in FIG. 8 and/or one or more different channels that are not shown in FIG. 8, such as a mud pulse channel.

The optical waveguide 210 can be used to carry light 802 as previously explained. In some cases, scattering center and/or partial reflector (e.g., 302A, 302B, 302N) can be implemented with the optical waveguide 210 to reflect and scatter light in order to detect/measure certain conditions/materials, as described herein. In some cases, a repeater 804 can be installed at the drill pipe 108 to boost signals carried by the optical waveguide 210. In some examples, the repeater 804 can be a battery-powered repeater or relays configured to boost or retransmit signals carried by the optical waveguide 210. The repeater 804 can not only remove unwanted noise from signals and/or reduce or eliminate attenuation of signals, but can also allow lower-power light sources such as LEDs to be used to transmit signals along the waveguide 210 and between a surface location and a downhole location.

The repeater 804 can be installed at one or more locations within the drill pipe 108. In some examples, the repeater 804 can be installed or inserted on the drill pipe 108 at one or more distances to boost a signal as it travels through the waveguide 210 (e.g., layers 204-208) on the inner surface 202 of the drill pipe 108. Moreover, in some cases, the repeater 804 can be installed or deposited within or into the layers 204-208 of the waveguide 210. In some examples, the number of repeaters implemented can be varied as needed based on one or more factors such as, for example, the type of light source used to transmit the signals, the distance between the signal origin and destination, conditions within the drill pipe 108, the conditions in the wellbore, etc.

As the repeater 804 receives a light signal, it can regenerate and amplify the signal to remove unwanted noise and reduce or overcome any attenuation of the signal. The repeater 804 can propagate the amplified signal along the waveguide 210 toward a destination. In some implementations, the repeater 804 can be used to relay or propagate signals outside of the drill pipe 108. For example, repeater 804 can relay signals to an external location 810 (e.g., a location outside of the drill pipe 108). The repeater 804 can relay the signal to the external location 810 in lieu of, or in addition to, relaying or retransmitting the signal along the waveguide 210 inside of the drill pipe 108. Moreover, in some cases, the repeater 804 can convert the signal into another form and transmit the converted signal to the external location 810. For example, the repeater 804 can convert the signal into an electrical or acoustic signal, and transmit (wirelessly or through a wire) the electrical or acoustic signal to the external location 810.

The external location 810 can be, for example and without limitation, a device on the surface of the wellbore and/or a device in the wellbore. The device can be, for example, a detector, a wireless device, a sensor device, a communication interface, a computing device, and/or any device capable of receiving data signals.

In some implementations, one or more light-emitting devices, such as LEDs or lasers, can be installed on, or integrated into, the drill pipe 108 to function as one or more transceivers on the optical waveguide 210 (e.g., layers 204-208). For example, LEDs can be distributed throughout the drill pipe 108 at various locations on the waveguide 210 (e.g., layers 204-208) and/or inner surface 202 of the drill pipe 108 to transmit light over the waveguide 210. In some cases, the LEDs or other light-emitting devices can be built into the drill pipe 108.

Moreover, in some examples, one or more electrically-modulated reflectors can be implemented at one or more locations on the inner surface 202 of the drill pipe 108 to modulate and reflect light signals. In some implementations, such reflectors can be implemented using materials that can modulate the intensity of light and/or control the transparency of light. For example, one or more reflective modulators can be implemented using material(s) capable of transitioning a light beam between transparent and opaque.

The optical fiber channel 806 can include one or more optical fiber strips installed or deposited within one or more layers of the optical waveguide 210, such as the high index layer 206. The optical fiber strips can provide the communication advantages of fiber optics, and can be used to separate or isolate communications through the optical fiber channel 806 from communications through the optical waveguide 210 and the acoustic waveguide 808.

The inner or outer surface of the drill pipe 108 can be leveraged and used as the acoustic waveguide 808 to carry acoustic waves containing information. The acoustic waveguide 808 can provide another layer of communication redundancy and isolation/separation.

A receiver 404 can be implemented to detect light reflected and received from the waveguide 210. The receiver 404 can be implemented at a surface location, a downhole location, or any other location. In some cases, the receiver 404 (or one or more different receivers) can be used to also receive and detect signals transmitted through the optical fiber channel 806. Moreover, a receiver can similarly be implemented to receive and detect acoustic waves transmitted through the acoustic waveguide 808. In some cases, multiple receivers can be implemented to provide receiver diversity and eliminate interference when multiple signals are combined.

Figure 9:
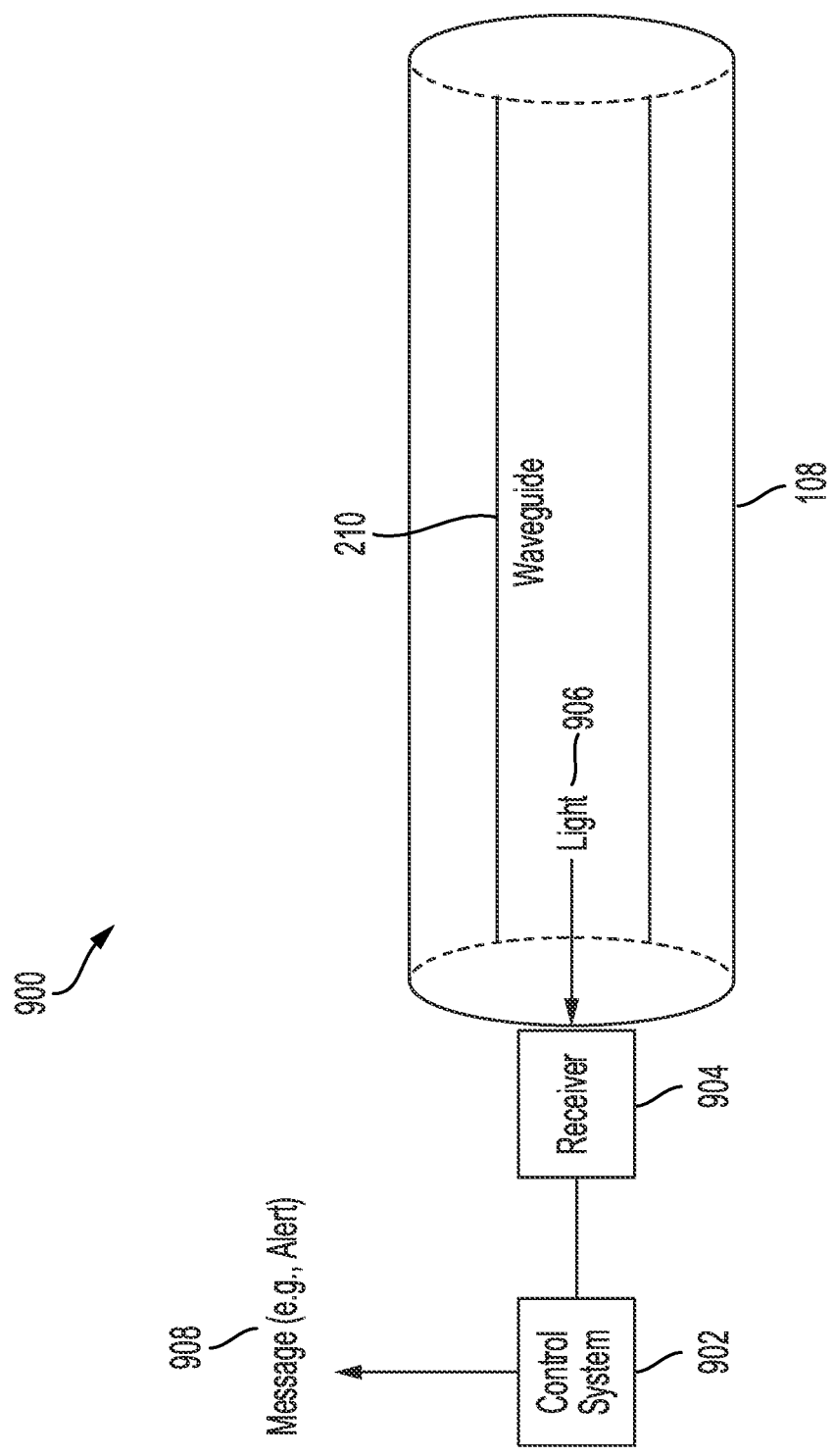
FIG. 9 is a diagram illustrating an example configuration of a system for generating notifications or alerts based on conditions detected using an optical waveguide, in accordance with some examples.

FIG. 9 illustrates an example configuration of system 900 for generating notifications or alerts based on conditions detected using the optical waveguide 210. In this example, a receiver 904 can be implemented to receive light 906 transmitted or reflected through the optical waveguide 210. The received light 906 can be analyzed to determine one or more conditions such as torque, strain, etc., as described herein. For example, in some cases, reflectors can be implemented to measure torque in the drill pipe 108.

In other examples, light scattering (e.g., via naturally occurring or induced scattering centers) can be analyzed and correlated to measure torque and/or detect an increase/decrease in torque. An increase in torque can indicate that production operations should be adjusted (e.g., by reducing penetration or drilling rate) to prevent potential failure points. Since torque is not evenly distributed along the drill pipe 108, a higher torque or strain at one location than another location can indicate a potential failure point or risk. Thus, the torque or strain can be measured to determine if a failure point is approaching and/or to detect a weakest link.

The receiver 904 can communicate with a control system 902, which can be configured to generate a message 908 when a torque measurement exceeds a certain threshold indicative of a potential failure or problem. The message 908 can be a notification or alert that is generated to inform an operator of the condition detected in the drill pipe 108. In some examples, the message 908 can be communicated through a wireless and/or wired connection to another device, such as a server or a computing device associated with an operator. In other examples, the message 908 can be a visual and/or audio message that is generated by the control system 902 to alert any nearby users of a certain condition such as a potential failure.

In some cases, the control system 902 and the receiver 904 can be part of, or implemented by, different devices. In other cases, the control system 902 and the receiver 904 can be part of, or implemented by, a same device or number of devices.

In some cases, the system 900 can be used to generate messages with notifications for conditions and/or events other than, or in addition to, torque conditions or events. For example, the system 900 can be used to generate notifications (e.g., via control system 902) of potential gas kick events/conditions, fluid accumulations, gas accumulations, pump conditions, drill pipe conditions (e.g., poor bonds, weak joints, corrosion, material gaps, etc.), temperature conditions, pressure conditions, volume, formations, hazards, etc.

Having disclosed some example system components and concepts, the disclosure now turns to FIGS. 10A and 10B, which illustrate example methods 1000 and 1020 for implementing an optical waveguide to communicate information to/from a downhole/surface location of a wellbore 116 and sensing materials and conditions in the wellbore 116. The steps outlined herein are exemplary and can be implemented in any combination thereof, including combinations that exclude, add, or modify certain steps.

At step 1002, the method 1000 can include depositing an optical waveguide (210) on an inner surface (202) of a wellbore tool (e.g., 108). In some cases, the wellbore tool can include a drill pipe (108), a wellbore tubular, a production tubing, casing, etc. Moreover, in some examples, the optical waveguide (210) can include a first layer (204) of low refractive-index material, a second layer (206) of high refractive-index material applied to a first surface of the first layer (204), and a third layer (208) of low refractive-index material applied to a second surface of the second layer (206).

In other examples, the optical waveguide (210) can include a different pattern, number of layers, and/or types of materials. For example, in some cases, the optical waveguide (210) can include a buffer or protective layer between the inner surface (202) of the wellbore tool and the first layer (204) and/or on an outer surface of the third layer (208), such as a surface opposite to the surface interfacing with the second layer (206). In yet other examples, the optical waveguide (210) can include one or more additional layers of low refractive-index, high refractive-index, and low refractive-index materials applied over a surface of the third layer (208). Such configuration can create multiple channels or waveguides for carrying light in a same and/or different direction.

In some cases, the first layer, the second layer, and/or the third layer on the inner surface of the wellbore tool can be deposited and/or chemically bonded using plasma-enhanced chemical vapor deposition or plasma-enhanced atomic layer deposition. Moreover, in some implementations, the low refractive-index material in the first and/or third layer can include silicon dioxide, sapphire crystal, fused silica, or any suitable low refractive-index dielectric oxide film, and the high refractive-index material can include silicon, germanium, gallium arsenide, or any high refractive-index semiconductor compound material.

In some examples, the optical waveguide (210) can be used to sense/detect various conditions and types of information as further described herein. In some cases, the optical waveguide (210) can also be used to communicate various types of data to and/or from a surface and/or downhole location. For example, the optical waveguide (210) can be used to communicate MWD/LWD data such as wellbore survey data and directional-drilling measurements, geosteering commands, sensor data, etc. To illustrate, the optical waveguide (210) can be used to communicate directional-drilling measurements and commands for use in steering the wellbore and data captured by one or more sensors at one or more locations along the wellbore.

At step 1004, the method 1000 can include configuring one or more non-uniformities (e.g., 302) at one or more locations of the optical waveguide (210). The one or more non-uniformities can be configured to reflect or scatter light that strikes or interfaces with the one or more non-uniformities. For example, the one or more non-uniformities can reflect or scatter light at one or more angles relative to a site of interaction between the light and the one or more non-uniformities.

In some examples, the one or more non-uniformities can include a partial reflector, a total reflector, a scattering center, and/or a reflector tuned to have one or more sensitivities. The one or more sensitivities can include, for example, a sensitivity to a particular wavelength, a sensitivity to a particular strain or stress, etc.

In some aspects, configuring the one or more non-uniformities at the one or more locations of the optical waveguide (210) can include embedding one or more materials in the optical waveguide (210) at the one or more locations, melting one or more materials at the one or more locations of the optical waveguide (210), depositing one or more materials at the one or more locations of the optical waveguide (210), etching the optical waveguide (210) at the one or more locations, shooting the one or more locations of the optical waveguide (210) with a laser to cause a local index of refraction change, etc. In some cases, the one or more non-uniformities can include a naturally occurring non-uniformity, such as a natural inhomogeneity in the optical waveguide (210).

At step 1006, the method 1000 can include determining a reflection pattern and/or a transmission pattern of light (e.g., 410, 502) propagated through the optical waveguide (210) and reflected or scattered by the one or more non-uniformities. The light can be partially or fully reflected by the one or more non-uniformities, as previously described.

In some examples, the reflection pattern can include a wavelength of a portion of light reflected by the one or more non-uniformities, a frequency of the portion of light reflected by the one or more non-uniformities, an intensity of the portion of light reflected by the one or more non-uniformities, an amount of attenuation associated with the portion of light reflected by the one or more non-uniformities, etc. In some examples, the transmission pattern can include a wavelength of a portion of light transmitted by the one or more non-uniformities, a frequency of the portion of light transmitted by the one or more non-uniformities, an intensity of the portion of light transmitted by the one or more non-uniformities, an amount of attenuation associated with the portion of light transmitted by the one or more non-uniformities, etc.

In other examples, the reflection pattern can include a spectroscopic fingerprint of a portion of light reflected by the one or more non-uniformities. Similarly, in some examples, the transmission pattern can include a spectroscopic fingerprint of a portion of light transmitted by the one or more non-uniformities.

At step 1008, the method 1000 can include determining, based on the reflection pattern and/or the transmission pattern of the light, one or more conditions associated with of the wellbore tool. In some examples, the one or more conditions can include a corrosion, an erosion, one or more gaps between two or more components, a strain, a torque, a tension, a temperature, a pressure, a location of one or more components associated with the wellbore tool, a configuration for connecting multiple components of the wellbore tool, a stress, etc.

For example, in some aspects, determining the one or more conditions associated with the wellbore tool can include identifying corrosion at one or more areas of the wellbore tool, erosion at one or more areas of the wellbore tool, one or more gaps between two or more components associated with the wellbore tool, a strain at one or more areas of the wellbore tool, a torque associated with the wellbore tool, a tension associated with the wellbore tool, a temperature at one or more areas of the wellbore tool, and/or a pressure at one or more areas of the wellbore tool. In some examples, the one or more areas of the wellbore tool can include a joint, a surface, and/or an inner region. Moreover, in some examples, the two or more components associated with the wellbore tool can include a pipe, a joint, an interface, a portion of the wellbore tool, and/or a second wellbore tool.

In other examples, determining the one or more conditions associated with the wellbore tool can include identifying an alignment for connecting two or more components associated with the wellbore tool, joint geometries for connecting two or more components associated with the wellbore tool, a torque for connecting two or more components associated with the wellbore tool, and/or a depth or location of two or more components associated with the wellbore tool. The two or more components associated with the wellbore tool can include, for example, a drill pipe (108), a joint (e.g., 306), a tubular, a casing, etc.

Moreover, in some examples, determining the one or more conditions associated with of the wellbore tool can be based on a pattern of the light propagated through the optical waveguide (210) prior to being reflected or scattered by the one or more non-uniformities. The pattern of the light can include, for example, a wavelength, a frequency, an intensity, an attenuation, etc.

In some aspects, the method 1000 can include propagating the light through the optical waveguide (210). In some examples, the light can be propagated using a light-emitting device (e.g., light source 402 or 406) at a location on a wellbore environment (e.g., 100). For example, a light-emitting device can generate the light and transfer or couple it to the optical waveguide (210) for propagation through the optical waveguide (210). The location on the wellbore environment can be, for example, a downhole location or a location at or near the surface of the wellbore (e.g., 116) in the wellbore environment. In some cases, the light transmitted can carry information communicated through the light, such as measurements for example.

In some aspects, the method 1000 can include transmitting or communicating, via the optical waveguide (210), optical data signals from a first location (e.g., a surface or downhole location) to a second location (e.g., a downhole or surface location). The optical data signals can include, for example, data or measurements captured by one or more sensors in the wellbore, geo-steering commands for directional drilling (e.g., bottom hole assembly commands), wellbore survey data and/or directional-drilling or MWD measurements. As one of skill in the art will recognize, the optical waveguide (210) can be used to communicate any other type of information. The various types of information described herein are provided as non-limiting examples for clarity and explanation purposes.

In some implementations, the wellbore tool can include one or more light sources, receivers, detectors, and/or spectral measurement devices (e.g., spectrometers, spectrophotometers, spectrographs, spectral analyzers, etc.) at one or more sections of the wellbore tool. The light sources can generate new light signals for propagation through the optical waveguide or process light signals carried by the optical waveguide. The receivers or detectors can be used to receive/detect light signals at one or more different locations on the wellbore tool. The spectral measurement devices can be used to analyze light received and determine a spectroscopic fingerprint of the light.

FIG. 10B illustrates an example method 1020 for implementing an optical waveguide (210) to obtain measurements and sense conditions using evanescent wave interactions. At step 1022, the method 1020 can include depositing an optical waveguide (210) on an inner surface (202) of a wellbore tool (e.g., 108). In some cases, the wellbore tool can include a drill pipe (108), a wellbore tubular, a production tubing, casing, etc. Moreover, in some examples, the optical waveguide (210) can include a first layer (204) of low refractive-index material, a second layer (206) of high refractive-index material applied to a first surface of the first layer (204), and a third layer (208) of low refractive-index material applied to a second surface of the second layer (206).

In other examples, the optical waveguide (210) can include a different pattern, number of layers, and/or types of materials. For example, in some cases, the optical waveguide (210) can include a buffer or protective layer between the inner surface (202) of the wellbore tool and the first layer (204) and/or on an outer surface of the third layer (208), such as a surface opposite to the surface interfacing with the second layer (206). In yet other examples, the optical waveguide (210) can include one or more additional layers of low refractive-index, high refractive-index, and low refractive-index materials applied over a surface of the third layer (208).

In some cases, the first layer, the second layer, and/or the third layer on the inner surface of the wellbore tool can be deposited and/or chemically bonded using plasma-enhanced chemical vapor deposition or plasma-enhanced atomic layer deposition. Moreover, in some implementations, the low refractive-index material in the first and/or third layer can include silicon dioxide, sapphire crystal, fused silica, or any suitable low refractive-index dielectric oxide film, and the high refractive-index material can include silicon, germanium, gallium arsenide, or any high refractive-index semiconductor compound material.

At step 1024, the method 1020 can include configuring an evanescent wave interaction region (710) at one or more first locations of the optical waveguide (210). In some examples, the evanescent wave interaction region (710) can include at least a portion of the first layer (204) of low refractive-index material, at least a portion of the second layer (206) of high refractive-index material, and/or an outer layer of low refractive-index material having a reduced thickness relative to the third layer (208) of low refractive-index material. For example, in some cases, the reduced thickness of the outer layer of low refractive-index material can be smaller than one or more wavelengths of light.

In some cases, the method 1020 can include configuring multiple evanescent wave interaction regions at different locations of the optical waveguide (210). In some examples, the multiple evanescent wave interaction regions can be configured at certain distances and/or lengths along the wellbore tool and/or the optical waveguide (210). Moreover, in some examples, the multiple evanescent wave interaction regions can be configured at specific depths within the wellbore (116) where the wellbore tool is implemented or used.

At step 1026, the method 1020 can include configuring one or more non-uniformities (e.g., 302) at one or more second locations of the optical waveguide (210). In some examples, the one or more second locations where the one or more non-uniformities are configured can be at a certain respective distance behind and/or in front (relative to incoming light) of the one or more first locations where the evanescent wave interaction region (710) is configured.

The one or more non-uniformities can be configured to reflect/scatter and/or transmit light that strikes or interfaces with the one or more non-uniformities, as previously explained. Moreover, in some examples, the one or more non-uniformities can include a partial reflector, a total reflector, a scattering center, and/or a reflector tuned to have one or more sensitivities. The one or more sensitivities can include, for example, a sensitivity to a particular wavelength, a sensitivity to a particular strain or stress, etc.

At step 1028, the method 1020 can include determining one or more characteristics of light (e.g., 704) reflected by the one or more non-uniformities after traveling through the evanescent wave interaction region (710). In some examples, the one or more characteristics of light reflected by the one or more non-uniformities can include a wavelength, a frequency, an intensity, an attenuation, a spectroscopic fingerprint, etc.

To determine the one or more characteristics of light, the light can be received/detected and analyzed using, for example, an optical detector/sensor or receiver (e.g., 404, 408) and/or a spectral measurement device (e.g., via spectroscopy) such as a spectrometer, spectrophotometer, spectrograph, spectral analyzer, etc. In some cases, determining the one or more characteristics of light reflected by the one or more non-uniformities can include determining a spectroscopic fingerprint of the light reflected by the one or more non-uniformities.

At step 1030, the method 1020 can include detecting, based on the one or more characteristics of light (e.g., 704) reflected by the one or more non-uniformities after traveling through the evanescent wave interaction region (710), one or more characteristics of an environment (e.g., inside 708) associated with the wellbore tool.

In some examples, detecting one or more characteristics of the environment associated with the wellbore tool can include sensing and/or measuring a presence, composition, and/or concentration of one or more components (706) located in an inside (708) of the wellbore tool and adjacent to the outer layer of low refractive-index material, such as evanescent area 712. The one or more components (706) can include, for example and without limitation, a particular formation (e.g., a wax formation, a bubble formation, etc.), one or more materials (e.g., cement, mud, joints, pipes, objects, etc.), one or more fluids (e.g., water, oil, etc.), one or more gasses, one or more substances, and/or one or more elements.

In some cases, sensing and/or measuring the presence, composition, and/or concentration of the one or more components (706) can be based on an evanescent wave interaction with the one or more components (706) resulting from a portion of the light extending outside of the outer layer of low refractive-index material (e.g., evanescent area 712) as the light traverses the evanescent wave interaction region.

In some aspects, detecting one or more characteristics of the environment associated with the wellbore tool can include detecting one or more conditions in the environment associated with the wellbore tool. The one or more conditions can include, for example and without limitation, a gas accumulation, a fluid accumulation, a gas bubble formation, a pressure, a temperature, a pump efficiency, an air gap, a fluid flow, and/or a gap of one or more materials such as mud or cement.

Having disclosed example systems, methods, and technologies for using an optical waveguide to sense/measure information and conditions, the disclosure now turns to FIG. 11, which illustrates an example computing device architecture 1100 that can be employed to perform various steps, methods, and techniques disclosed herein. The various implementations will be apparent to those of ordinary skill in the art when practicing the present technology. Persons of ordinary skill in the art will also readily appreciate that other system implementations or examples are possible.

As noted above, FIG. 11 illustrates an example computing device architecture 1100 of a computing device that can implement various technologies and techniques described herein. For example, the computing device architecture 1100 can implement one or more computing devices described herein (e.g., receiver 404, receiver 408, receiver 904, control system 902, etc.) and perform various steps, methods, and techniques disclosed herein, such as one or more steps of the methods 1000 and/or 1020 shown in FIGS. 10A and 10B.

The components of the computing device architecture 1100 are shown in electrical communication with each other using a connection 1105, such as a bus. The example computing device architecture 1100 includes a processing unit (CPU or processor) 1110 and a computing device connection 1105 that couples various computing device components including the computing device memory 1115, such as read only memory (ROM) 1120 and random access memory (RAM) 1125, to the processor 1110.

The computing device architecture 1100 can include a cache of high-speed memory connected directly with, in close proximity to, or integrated as part of the processor 1110. The computing device architecture 1100 can copy data from the memory 1115 and/or the storage device 1130 to the cache 1112 for quick access by the processor 1110. In this way, the cache can provide a performance boost that avoids processor 1110 delays while waiting for data. These and other modules can control or be configured to control the processor 1110 to perform various actions. Other computing device memory 1115 may be available for use as well. The memory 1115 can include multiple different types of memory with different performance characteristics. The processor 1110 can include any general purpose processor and a hardware or software service, such as service 1 1132, service 2 1134, and service 3 1136 stored in storage device 1130, configured to control the processor 1110 as well as a special-purpose processor where software instructions are incorporated into the processor design. The processor 1110 may be a self-contained system, containing multiple cores or processors, a bus, memory controller, cache, etc. A multi-core processor may be symmetric or asymmetric.

To enable user interaction with the computing device architecture 1100, an input device 1145 can represent any number of input mechanisms, such as a microphone for speech, a touch-sensitive screen for gesture or graphical input, keyboard, mouse, motion input, speech and so forth. An output device 1135 can also be one or more of a number of output mechanisms known to those of skill in the art, such as a display, projector, television, speaker device, etc. In some instances, multimodal computing devices can enable a user to provide multiple types of input to communicate with the computing device architecture 1100. The communications interface 1140 can generally govern and manage the user input and computing device output. There is no restriction on operating on any particular hardware arrangement and therefore the basic features here may easily be substituted for improved hardware or firmware arrangements as they are developed.

Storage device 1130 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 1125, read only memory (ROM) 1120, and hybrids thereof. The storage device 1130 can include services 1132, 1134, 1136 for controlling the processor 1110. Other hardware or software modules are contemplated. The storage device 1130 can be connected to the computing device connection 1105. In one aspect, a hardware module that performs a particular function can include the software component stored in a computer-readable medium in connection with the necessary hardware components, such as the processor 1110, connection 1105, output device 1135, and so forth, to carry out the function.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can include, for example, instructions and data which cause or otherwise configure a general purpose computer, special purpose computer, or a processing device to perform a certain function or group of functions. Portions of computer resources used can be accessible over a network. The computer executable instructions may be, for example, binaries, intermediate format instructions such as assembly language, firmware, source code, etc. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can include hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific embodiments thereof, but those skilled in the art will recognize that the application is not limited thereto. Thus, while illustrative embodiments of the application have been described in detail herein, it is to be understood that the disclosed concepts may be otherwise variously embodied and employed, and that the appended claims are intended to be construed to include such variations, except as limited by the prior art. Various features and aspects of the above-described subject matter may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The various illustrative logical blocks, modules, circuits, and algorithm steps described in connection with the examples disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the method, algorithms, and/or operations described above. The computer-readable data storage medium may form part of a computer program product, which may include packaging materials.

The computer-readable medium may include memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

In the above description, terms such as "upper," "upward," "lower," "downward," "above," "below," "downhole," "uphole," "longitudinal," "lateral," and the like, as used herein, shall mean in relation to the bottom or furthest extent of the surrounding wellbore even though the wellbore or portions of it may be deviated or horizontal. Correspondingly, the transverse, axial, lateral, longitudinal, radial, etc., orientations shall mean orientations relative to the orientation of the wellbore or tool. Additionally, the illustrate embodiments are illustrated such that the orientation is such that the right-hand side is downhole compared to the left-hand side.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicate that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder.

The term "radially" means substantially in a direction along a radius of the object, or having a directional component in a direction along a radius of the object, even if the object is not exactly circular or cylindrical. The term "axially" means substantially along a direction of the axis of the object. If not specified, the term axially is such that it refers to the longer axis of the object.

Although a variety of information was used to explain aspects within the scope of the appended claims, no limitation of the claims should be implied based on particular features or arrangements, as one of ordinary skill would be able to derive a wide variety of implementations. Further and although some subject matter may have been described in language specific to structural features and/or method steps, it is to be understood that the subject matter defined in the appended claims is not necessarily limited to these described features or acts. Such functionality can be distributed differently or performed in components other than those identified herein. The described features and steps are disclosed as possible components of systems and methods within the scope of the appended claims.

Moreover, claim language reciting "at least one of" a set indicates that one member of the set or multiple members of the set satisfy the claim. For example, claim language reciting "at least one of A and B" means A, B, or A and B.

Statements of the disclosure include:

Statement 1: A method comprising depositing an optical waveguide on an inner surface of a wellbore tool, the optical waveguide comprising a first layer of low refractive-index material, a second layer of high refractive-index material applied to a first surface of the first layer, and a third layer of low refractive-index material applied to a second surface of the second layer; configuring one or more non-uniformities at one or more locations of the optical waveguide, the one or more non-uniformities being configured to reflect or scatter light at one or more angles relative to a site of interaction between the light and the one or more non-uniformities; determining a reflection pattern and/or a transmission pattern of light propagated through the optical waveguide and reflected or scattered by the one or more non-uniformities; and based on the reflection pattern and/or the transmission pattern of the light, determining one or more conditions associated with of the wellbore tool.

Statement 2: A method according to Statement 1, wherein determining the one or more conditions associated with the wellbore tool comprises identifying corrosion at one or more areas of the wellbore tool, erosion at one or more areas of the wellbore tool, one or more gaps between two or more components associated with the wellbore tool, a strain at one or more areas of the wellbore tool, a torque associated with the wellbore tool, a tension associated with the wellbore tool, a temperature at one or more areas of the wellbore tool, and/or a pressure at one or more areas of the wellbore tool.

Statement 3: A method according to Statement 2, wherein the one or more areas of the wellbore tool comprise a joint, a surface, and/or an inner region, and wherein at least one of the two or more components associated with the wellbore tool comprises a pipe, a joint, an interface, a portion of the wellbore tool, and/or a second wellbore tool.

Statement 4: A method according to any of Statements 1 through 3, wherein determining the one or more conditions associated with the wellbore tool comprises identifying an alignment for connecting two or more components associated with the wellbore tool, joint geometries for connecting two or more components associated with the wellbore tool, a torque for connecting two or more components associated with the wellbore tool, and/or a depth or location of two or more components associated with the wellbore tool.

Statement 5: A method according to Statement 4, wherein the two or more components associated with the wellbore tool comprise a drill pipe, a joint, and/or a tubular.

Statement 6: A method according to any of Statements 1 through 5, wherein the reflection pattern comprises a first wavelength of a portion of light reflected by the one or more non-uniformities, a first frequency of the portion of light reflected by the one or more non-uniformities, a first intensity of the portion of light reflected by the one or more non-uniformities, and/or an amount of attenuation associated with the portion of light reflected by the one or more non-uniformities, and wherein the transmission pattern comprises a second wavelength of a portion of light transmitted by the one or more non-uniformities, a second frequency of the portion of light transmitted by the one or more non-uniformities, a second intensity of the portion of light transmitted by the one or more non-uniformities, and/or an amount of attenuation associated with the portion of light transmitted by the one or more non-uniformities.

Statement 7: A method according to any of Statements 1 through 6, further comprising propagating the light through the optical waveguide, wherein determining the one or more conditions associated with of the wellbore tool is further based on a pattern of the light propagated through the optical waveguide prior to being reflected or scattered by the one or more non-uniformities, the pattern of the light comprising a third wavelength, a third frequency, and/or a third intensity.

Statement 8: A method according to any of Statements 1 through 7, wherein the reflection pattern comprises a first spectroscopic fingerprint of a portion of light reflected by the one or more non-uniformities and the transmission pattern comprises a second spectroscopic fingerprint of a portion of light transmitted by the one or more non-uniformities.

Statement 9: A method according to any of Statements 1 through 8, wherein the wellbore tool comprises a drill pipe, a wellbore tubular, a production tubing, and/or casing, and wherein the one or more non-uniformities comprise a partial reflector, a total reflector, a scattering center, and/or a reflector tuned to have one or more sensitivities, the one or more sensitivities comprising a sensitivity to a particular wavelength and/or a sensitivity to a particular strain or stress.

Statement 10: A method according to any of Statements 1 through 9, wherein configuring the one or more non-uniformities at the one or more locations of the optical waveguide comprises embedding one or more materials in the optical waveguide, melting one or more materials at the one or more locations of the optical waveguide, depositing one or more materials at the one or more locations of the optical waveguide, etching the optical waveguide at the one or more locations, and/or shooting the one or more locations of the optical waveguide with a laser to cause a local index of refraction change.

Statement 11: A system comprising: a wellbore tool; an optical waveguide on an inner surface of the wellbore tool, the optical waveguide comprising a first layer of low refractive-index material, a second layer of high refractive-index material applied to a first surface of the first layer, and a third layer of low refractive-index material applied to a second surface of the second layer; one or more non-uniformities at one or more locations of the optical waveguide, the one or more non-uniformities being configured to reflect or scatter light at one or more angles relative to a site of interaction between the light and the one or more non-uniformities; and an apparatus configured to determine a reflection pattern and/or a transmission pattern of light propagated through the optical waveguide and reflected or scattered by the one or more non-uniformities and determine, based on the reflection pattern and/or the transmission pattern of the light, one or more conditions associated with of the wellbore tool.

Statement 12: A system according to Statement 11, wherein the apparatus comprises a light-emitting device for propagating light through the optical waveguide, a spectral measurement device, and/or an optical receiver for receiving light propagated, reflected, scattered or transmitted through the optical waveguide.

Statement 13: A system according to any of Statements 11 and 12, wherein determining the one or more conditions associated with the wellbore tool comprises identifying corrosion at one or more areas of the wellbore tool, erosion at one or more areas of the wellbore tool, one or more gaps between two or more components associated with the wellbore tool, a strain at one or more areas of the wellbore tool, a torque associated with the wellbore tool, a tension associated with the wellbore tool, a temperature at one or more areas of the wellbore tool, and/or a pressure at one or more areas of the wellbore tool.

Statement 14: A system according to Statement 13, wherein the one or more areas of the wellbore tool comprise a joint, a surface, and/or an inner region, and wherein at least one of the two or more components associated with the wellbore tool comprises a pipe, a joint, an interface, a portion of the wellbore tool, and/or a second wellbore tool.

Statement 15: A system according to any of Statements 11 through 14, wherein determining the one or more conditions associated with the wellbore tool comprises identifying an alignment for connecting two or more components associated with the wellbore tool, joint geometries for connecting two or more components associated with the wellbore tool, a torque for connecting two or more components associated with the wellbore tool, and/or a depth or location of two or more components associated with the wellbore tool.

Statement 16: A system according to any of Statements 11 through 15, wherein the reflection pattern comprises a first wavelength of a portion of light reflected by the one or more non-uniformities, a first frequency of the portion of light reflected by the one or more non-uniformities, a first intensity of the portion of light reflected by the one or more non-uniformities, and/or an amount of attenuation associated with the portion of light reflected by the one or more non-uniformities, and wherein the transmission pattern comprises a second wavelength of a portion of light transmitted by the one or more non-uniformities, a second frequency of the portion of light transmitted by the one or more non-uniformities, a second intensity of the portion of light transmitted by the one or more non-uniformities, and/or an amount of attenuation associated with the portion of light transmitted by the one or more non-uniformities.

Statement 17: A system according to any of Statements 11 through 16, wherein the apparatus is further configured to propagate the light through the optical waveguide, wherein determining the one or more conditions associated with of the wellbore tool is further based on a pattern of the light propagated through the optical waveguide prior to being reflected or scattered by the one or more non-uniformities, the pattern of the light comprising a third wavelength, a third frequency, and/or a third intensity.

Statement 18: A system according to any of Statements 11 through 17, wherein the reflection pattern comprises a first spectroscopic fingerprint of at least a portion of light reflected by the one or more non-uniformities and the transmission pattern comprises a second spectroscopic fingerprint of at least a portion of light transmitted by the one or more non-uniformities.

Statement 19: A system according to any of Statements 11 through 18, wherein the wellbore tool comprises a drill pipe, a wellbore tubular, a production tubing, and/or casing, and wherein the one or more non-uniformities comprise a partial reflector, a total reflector, a scattering center, and/or a reflector tuned to have one or more sensitivities, the one or more sensitivities comprising a sensitivity to a particular wavelength, strain and/or stress.

Statement 20: A system according to any of Statements 11 through 19, wherein the one or more non-uniformities at the one or more locations of the optical waveguide comprise one or more materials embedded in the optical waveguide, one or more materials melted at the one or more locations of the optical waveguide, one or more materials deposited at the one or more locations of the optical waveguide, an etching of the optical waveguide at the one or more locations, and/or one or more materials at the one or more locations of the optical waveguide shot with a laser to cause a local index of refraction change.

Statement 21: A system comprising means for performing a method according to any of Statements 1 through 10.

Statement 22: At least one non-transitory computer-readable storage medium having stored thereon instructions which, when executed by one or more processing devices, cause the one or more processing devices to perform a method according to any of Statements 1 through 10.

Statement 23: A method comprising depositing, on an inner surface of a wellbore tool, an optical waveguide comprising a first layer of low refractive-index material, a second layer of high refractive-index material applied to a first surface of the first layer, and a third layer of low refractive-index material applied to a second surface of the second layer; configuring an evanescent wave interaction region at one or more first locations of the optical waveguide, the evanescent wave interaction region comprising at least a portion of the first layer of low refractive-index material, at least a portion of the second layer of high refractive-index material, and an outer layer of low refractive-index material having a reduced thickness relative to the third layer of low refractive-index material; configuring one or more non-uniformities at one or more second locations of the optical waveguide, the one or more non-uniformities being configured to reflect light; determining one or more characteristics of light reflected by the one or more non-uniformities after traveling through the evanescent wave interaction region; and based on the one or more characteristics of light reflected by the one or more non-uniformities after traveling through the evanescent wave interaction region, detecting one or more characteristics of an environment associated with the wellbore tool.

Statement 24: A method according to Statement 23, wherein the reduced thickness of the outer layer of low refractive-index material is smaller than one or more wavelengths of light.

Statement 25: A method of any of Statements 23 through 24, wherein detecting one or more characteristics of the environment associated with the wellbore tool comprises sensing a presence, a composition, and/or a concentration of one or more components located in an inside of the wellbore tool and adjacent to the outer layer of low refractive-index material.

Statement 26: A method according to Statement 25, wherein the one or more components comprise a particular formation, one or more materials, one or more fluids, one or more gasses, one or more substances, and/or one or more elements.

Statement 27: A method according to Statement 25, wherein sensing the presence, the composition, and/or the concentration of the one or more components is based on an evanescent wave interaction with the one or more components resulting from a portion of the light extending outside of the outer layer of low refractive-index material as the light traverses the evanescent wave interaction region.

Statement 28: A method according to any of Statements 23 through 27, wherein detecting one or more characteristics of the environment associated with the wellbore tool comprises detecting one or more conditions in the environment associated with the wellbore tool, the one or more conditions comprising a gas accumulation, a fluid accumulation, a gas bubble formation, a pressure, a temperature, a pump efficiency, an air gap, and/or a mud gap.

Statement 29: A method according to any of Statements 23 through 28, wherein the one or more characteristics of light reflected by the one or more non-uniformities comprise a wavelength, a frequency, an intensity, and/or an attenuation.

Statement 30: A method according to any of Statements 23 through 29, wherein determining the one or more characteristics of light reflected by the one or more non-uniformities comprises determining a spectroscopic fingerprint of the light reflected by the one or more non-uniformities.

Statement 31: A method according to any of Statements 23 through 30, wherein the wellbore tool comprises a drill pipe, a wellbore tubular, a production tubing, and/or casing, and wherein the one or more non-uniformities comprise a partial reflector, a total reflector, a scattering center, and/or a reflector tuned to have one or more sensitivities, the one or more sensitivities comprising a sensitivity to a particular wavelength, strain and/or stress.

Statement 32: A system comprising a wellbore tool; an optical waveguide on an inner surface of the wellbore tool, the optical waveguide comprising a first layer of low refractive-index material, a second layer of high refractive-index material applied to a first surface of the first layer, and a third layer of low refractive-index material applied to a second surface of the second layer; an evanescent wave interaction region at one or more first locations of the optical waveguide, the evanescent wave interaction region comprising at least a portion of the first layer of low refractive-index material, at least a portion of the second layer of high refractive-index material, and an outer layer of low refractive-index material having a reduced thickness relative to the third layer of low refractive-index material; one or more non-uniformities at one or more second locations of the optical waveguide, the one or more non-uniformities being configured to reflect light; and an apparatus configured to determine one or more characteristics of light reflected by the one or more non-uniformities after traveling through the evanescent wave interaction region and, based on the one or more characteristics of light reflected by the one or more non-uniformities after traveling through the evanescent wave interaction region, detect one or more characteristics of an environment associated with the wellbore tool.

Statement 33: A system according to Statement 32, wherein the reduced thickness of the outer layer of low refractive-index material is smaller than one or more wavelengths of light.

Statement 34: A system according to any of Statements 32 through 33, wherein detecting one or more characteristics of the environment associated with the wellbore tool comprises sensing a presence, a composition, and/or a concentration of one or more components located in an inside of the wellbore tool and adjacent to the outer layer of low refractive-index material.

Statement 35. A system according to Statement 34, wherein the one or more components comprise a particular formation, one or more materials, one or more fluids, one or more gasses, one or more substances, and/or one or more elements.

Statement 36. A system according to any of Statements 34 through 35, wherein sensing the presence, the composition, and/or the concentration of the one or more components is based on an evanescent wave interaction with the one or more components resulting from a portion of the light extending outside of the outer layer of low refractive-index material as the light traverses the evanescent wave interaction region.

Statement 37: A system according to any of Statements 34 through 36, wherein detecting one or more characteristics of the environment associated with the wellbore tool comprises detecting one or more conditions in the environment associated with the wellbore tool, the one or more conditions comprising a gas accumulation, a fluid accumulation, a gas bubble formation, a pressure, a temperature, a pump efficiency, an air gap, and/or a mud gap.

Statement 38: A system according to any of Statements 32 through 37, wherein the one or more characteristics of light reflected by the one or more non-uniformities comprise a wavelength, a frequency, an intensity, and/or an attenuation.

Statement 39: A system according to any of Statements 32 through 38, wherein determining the one or more characteristics of light reflected by the one or more non-uniformities comprises determining a spectroscopic fingerprint of the light reflected by the one or more non-uniformities.

Statement 40: A system according to any of Statements 32 through 39, wherein the wellbore tool comprises a drill pipe, a wellbore tubular, a production tubing, and/or casing, and wherein the one or more non-uniformities comprise a partial reflector, a total reflector, a scattering center, and/or a reflector tuned to have one or more sensitivities, the one or more sensitivities comprising a sensitivity to a particular wavelength, strain and/or stress.

Statement 41: A system according to any of Statements 32 through 40, wherein the apparatus is further configured to propagate the light through the optical waveguide, and wherein the apparatus comprises at least one of a light-emitting device for propagating light through the optical waveguide, a spectral measurement device, and an optical receiver for receiving light propagated, reflected, scattered or transmitted through the optical waveguide.

Statement 42: A system comprising means for performing a method according to any of Statements 23 through 31.

Statement 43: At least one non-transitory computer-readable storage medium having stored thereon instructions which, when executed by one or more processing devices, cause the one or more processing devices to perform a method according to any of Statements 23 through 31.

What is claimed is:

1. A method comprising:
depositing, on an inner surface of a wellbore tool, an optical waveguide comprising a first layer of low refractive-index material, a second layer of high refractive-index material applied to a first surface of the first layer, and a third layer of low refractive-index material applied to a second surface of the second layer;
configuring an evanescent wave interaction region at one or more first locations of the optical waveguide, the evanescent wave interaction region comprising at least a portion of the first layer of low refractive-index material, at least a portion of the second layer of high refractive-index material, and an outer layer of low refractive-index material having a reduced thickness relative to the third layer of low refractive-index material;
configuring one or more non-uniformities at one or more second locations of the optical waveguide, the one or more non-uniformities being configured to reflect light;
determining one or more characteristics of light reflected by the one or more non-uniformities after traveling through the evanescent wave interaction region; and
based on the one or more characteristics of light reflected by the one or more non-uniformities after traveling through the evanescent wave interaction region, detecting one or more characteristics of an environment associated with the wellbore tool.

2. The method of claim 1, wherein the reduced thickness of the outer layer of low refractive-index material is smaller than one or more wavelengths of light.

3. The method of claim 1, wherein detecting one or more characteristics of the environment associated with the wellbore tool comprises sensing at least one of a presence, a composition, and a concentration of one or more components located in an inside of the wellbore tool and adjacent to the outer layer of low refractive-index material.

4. The method of claim 3, wherein the one or more components comprise at least one of a particular formation, one or more materials, one or more fluids, one or more gasses, one or more substances, and one or more elements.

5. The method of claim 3, wherein detecting one or more characteristics of the environment associated with the wellbore tool comprises detecting one or more conditions in the environment associated with the wellbore tool, the one or more conditions comprising at least one of a gas accumulation, a fluid accumulation, a gas bubble formation, a pressure, a temperature, a pump efficiency, an air gap, and a mud gap.

6. The method of claim 3, wherein sensing at least one of the presence, the composition, and the concentration of the one or more components is based on an evanescent wave interaction with the one or more components resulting from a portion of the light extending outside of the outer layer of low refractive-index material as the light traverses the evanescent wave interaction region.

7. The method of claim 1, wherein the one or more characteristics of light reflected by the one or more non-uniformities comprise at least one of a wavelength, a frequency, an intensity, and an attenuation.

8. The method of claim 1, wherein determining the one or more characteristics of light reflected by the one or more non-uniformities comprises determining a spectroscopic fingerprint of the light reflected by the one or more non-uniformities.

9. The method of claim 1, wherein the wellbore tool comprises at least one of a drill pipe, a wellbore tubular, a production tubing, and casing, and wherein the one or more non-uniformities comprise at least one of a partial reflector, a total reflector, a scattering center, and a reflector tuned to have one or more sensitivities, the one or more sensitivities comprising at least one of a sensitivity to a particular wavelength and a sensitivity to a particular strain or stress.

10. A system comprising:
a wellbore tool;
an optical waveguide on an inner surface of the wellbore tool, the optical waveguide comprising a first layer of low refractive-index material, a second layer of high refractive-index material applied to a first surface of the first layer, and a third layer of low refractive-index material applied to a second surface of the second layer;
an evanescent wave interaction region at one or more first locations of the optical waveguide, the evanescent wave interaction region comprising at least a portion of the first layer of low refractive-index material, at least a portion of the second layer of high refractive-index material, and an outer layer of low refractive-index material having a reduced thickness relative to the third layer of low refractive-index material;
one or more non-uniformities at one or more second locations of the optical waveguide, the one or more non-uniformities being configured to reflect light; and
an apparatus configured to:
determine one or more characteristics of light reflected by the one or more non-uniformities after traveling through the evanescent wave interaction region; and
based on the one or more characteristics of light reflected by the one or more non-uniformities after traveling through the evanescent wave interaction region, detect one or more characteristics of an environment associated with the wellbore tool.

11. The system of claim 10, wherein the reduced thickness of the outer layer of low refractive-index material is smaller than one or more wavelengths of light.

12. The system of claim 10, wherein detecting one or more characteristics of the environment associated with the wellbore tool comprises sensing at least one of a presence, a composition, and a concentration of one or more components located in an inside of the wellbore tool and adjacent to the outer layer of low refractive-index material.

13. The system of claim 12, wherein the one or more components comprise at least one of a particular formation, one or more materials, one or more fluids, one or more gasses, one or more substances, and one or more elements.

14. The system of claim 12, wherein detecting one or more characteristics of the environment associated with the wellbore tool comprises detecting one or more conditions in the environment associated with the wellbore tool, the one or more conditions comprising at least one of a gas accumulation, a fluid accumulation, a gas bubble formation, a pressure, a temperature, a pump efficiency, an air gap, and a mud gap.

15. The system of claim 12, wherein sensing at least one of the presence, the composition, and the concentration of the one or more components is based on an evanescent wave interaction with the one or more components resulting from a portion of the light extending outside of the outer layer of low refractive-index material as the light traverses the evanescent wave interaction region.

16. The system of claim 10, wherein the one or more characteristics of light reflected by the one or more non-uniformities comprise at least one of a wavelength, a frequency, an intensity, and an attenuation.

17. The system of claim 10, wherein determining the one or more characteristics of light reflected by the one or more non-uniformities comprises determining a spectroscopic fingerprint of the light reflected by the one or more non-uniformities.

18. The system of claim 10, wherein the wellbore tool comprises at least one of a drill pipe, a wellbore tubular, a production tubing, and casing, and wherein the one or more non-uniformities comprise at least one of a partial reflector, a total reflector, a scattering center, and a reflector tuned to have one or more sensitivities, the one or more sensitivities comprising at least one of a sensitivity to a particular wavelength and a sensitivity to a particular strain or stress.

19. The system of claim 10, wherein the apparatus is further configured to propagate the light through the optical waveguide, and wherein the apparatus comprises at least one of a light-emitting device for propagating light through the optical waveguide, a spectral measurement device, and an optical receiver for receiving light propagated, reflected, scattered or transmitted through the optical waveguide.

* * * * *